(12) United States Patent
Yang

(10) Patent No.: US 12,532,448 B2
(45) Date of Patent: Jan. 20, 2026

(54) SEMICONDUCTOR STRUCTURE AND METHOD FOR MANUFACTURING SEMICONDUCTOR STRUCTURE

(71) Applicant: CHANGXIN MEMORY TECHNOLOGIES, INC., Hefei (CN)

(72) Inventor: Mengmeng Yang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 429 days.

(21) Appl. No.: 18/154,196

(22) Filed: Jan. 13, 2023

(65) Prior Publication Data

US 2024/0064954 A1 Feb. 22, 2024

(30) Foreign Application Priority Data

Aug. 19, 2022 (CN) .......................... 202210999636.6

(51) Int. Cl.
*H10B 12/00* (2023.01)
(52) U.S. Cl.
CPC ............. *H10B 12/03* (2023.02); *H10B 12/05* (2023.02); *H10B 12/482* (2023.02)
(58) Field of Classification Search
CPC ...... H10B 12/03; H10B 12/05; H10B 12/482; H10D 1/714; H10D 1/711
See application file for complete search history.

(56) References Cited

U.S. PATENT DOCUMENTS 12,289,894 B1 * 4/2025 Dokania ............. H10B 12/315
2022/0045064 A1 2/2022 Jung et al.

FOREIGN PATENT DOCUMENTS

CN 114068568 A 2/2022

* cited by examiner

*Primary Examiner* — Mohammad A Rahman
(74) *Attorney, Agent, or Firm* — Syncoda LLC; Feng Ma

(57) ABSTRACT

A semiconductor structure and a method for manufacturing a semiconductor structure are provided. The semiconductor structure includes: a substrate; and a plurality of capacitor structures arranged on a surface of the substrate. Each of the plurality of capacitor structures extends in a first direction. The first direction is parallel to the surface of the substrate. Each of the plurality of capacitor structures includes a lower electrode layer, a capacitor dielectric layer and an upper electrode layer. The lower electrode layer is provided with a U-shaped groove. The U-shaped groove is at least completely filled with the capacitor dielectric layer and the upper electrode layer. The capacitor dielectric layer is arranged between the lower electrode layer and the upper electrode layer.

9 Claims, 15 Drawing Sheets

SEMICONDUCTOR STRUCTURE AND METHOD FOR MANUFACTURING SEMICONDUCTOR STRUCTURE

CROSS-REFERENCE TO RELATED APPLICATION

This application is based upon and claims priority to Chinese Patent Application No. 202210999636.6, filed on Aug. 19, 2022 and entitled "SEMICONDUCTOR STRUCTURE AND METHOD FOR MANUFACTURING SEMICONDUCTOR STRUCTURE", the contents of which are incorporated herein by reference in its entirety.

BACKGROUND

With continuous development of semiconductor structures, critical dimensions of the semiconductor structures are continuously reduced. However, due to the limitation of the lithography machine, there is a limit on the reduction of the crucial dimensions of the semiconductor structures. Therefore, how to make a chip with a higher storage density on a wafer is the research direction for many researchers and semiconductor practitioners. In a two-dimensional or planar semiconductor device, memory cells are all arranged in a horizontal direction. Therefore, since the integration density of the two-dimensional or planar semiconductor device can be determined by the area occupied by a unit memory cell, the integration density of the two-dimensional or planar semiconductor device is greatly affected by a technology for forming a fine pattern, so that there is a limit on the continuous increase of the integration density of the two-dimensional or planar semiconductor device. Therefore, the semiconductor device tends to develop into a three-dimensional semiconductor device.

However, as the demand for a capacitor structure with large capacitance increases, it is difficult to control the dimension of the capacitor structure while improving the integration density of the semiconductor structure. Thus, it is difficult to achieve a balance between a layout space occupied by the capacitor structure in the semiconductor structure and the capacitance of the capacitor structure.

SUMMARY

Embodiments of the disclosure relates to the technical field of semiconductors, in particular to a semiconductor structure and a method for manufacturing a semiconductor structure.

Embodiments of the disclosure provide a semiconductor structure and a method for manufacturing a semiconductor structure, which at least contributes to improving the capacitance of the capacitor structure while improving the integration density of the semiconductor structure.

According to some embodiments of the disclosure, in one aspect, the embodiments of the disclosure provide a semiconductor structure. The semiconductor structure includes: a substrate; and a plurality of capacitor structures arranged on a surface of the substrate. Each of the plurality of capacitor structures extends in a first direction. The first direction is parallel to the surface of the substrate. Each of the plurality of capacitor structures includes a lower electrode layer, a capacitor dielectric layer and an upper electrode layer. The lower electrode layer is provided with a U-shaped groove. The U-shaped groove is at least completely filled with the capacitor dielectric layer and the upper electrode layer. The capacitor dielectric layer is arranged between the lower electrode layer and the upper electrode layer.

According to some embodiments of the disclosure, in another aspect, the embodiments of the disclosure provide a method for manufacturing a semiconductor structure, which includes the following operations. A substrate is provided. A plurality of capacitor structures are formed on a surface of the substrate, in which each of the plurality of capacitor structures extends in a first direction, and the first direction is parallel to the surface of the substrate. Each of the plurality of capacitor structures includes a lower electrode layer, a capacitor dielectric layer and an upper electrode layer. The lower electrode layer is provided with a U-shaped groove. The U-shaped groove is at least completely filled with the capacitor dielectric layer and the upper electrode layer. The capacitor dielectric layer is arranged between the lower electrode layer and the upper electrode layer.

BRIEF DESCRIPTION OF THE DRAWINGS

One or more embodiments are exemplarily explained through the figures in the accompanying drawings corresponding thereto, these exemplary explanations do not constitute a limitation to the embodiments. The elements having the same reference numerals in the accompanying drawings are denoted as similar elements. Unless otherwise specifically declared, the figures in the accompanying drawings do not constitute a limitation of proportion. In order to describe the technical solutions in the embodiments of the disclosure or traditional technologies more clearly, the accompanying drawings required to be used in the embodiments will be simply introduced below. It is apparent that the accompanying drawings described below show merely some embodiments of the disclosure. Persons of ordinary skill in the art may still derive other accompanying drawings from these accompanying drawings without creative efforts.

DETAILED DESCRIPTION

It can be known from BACKGROUND that the capacitance and the integration density of the capacitor structure in the semiconductor structure need to be improved.

Embodiments of the disclosure provide a semiconductor structure and a method for manufacturing a semiconductor structure. In the semiconductor structure, the upper electrode layer is arranged in the U-shaped groove of the lower electrode layer. On the one hand, the sidewalls, which form the U-shaped groove, of the lower electrode layer directly face toward the upper electrode layer, so as to improve the direct-facing area between the upper electrode layer and the lower electrode layer. On the other hand, in a direction perpendicular to the surface of the substrate, the upper electrode layer is arranged in the lower electrode layer, which contributes to reducing the overall layout area occupied by the upper electrode layer, without increasing the width of the lower electrode layer. Therefore, the semiconductor structure provided by the embodiments of the disclosure contributes to improving the integration density of the capacitor structure in the semiconductor structure, while improving the capacitance of the capacitor structure.

Hereinafter, the respective embodiments of the disclosure will be described in detail in combination with the accompanying drawings. However, those of ordinary skill in the art may understand that, in the respective embodiments of the disclosure, numerous technical details are set forth in order to provide a reader with a better understanding of the embodiments of the disclosure. However, the technical solutions claimed in the disclosure may also be implemented without these technical details and various changes and modifications based on the respective embodiments below.

Figure 5:
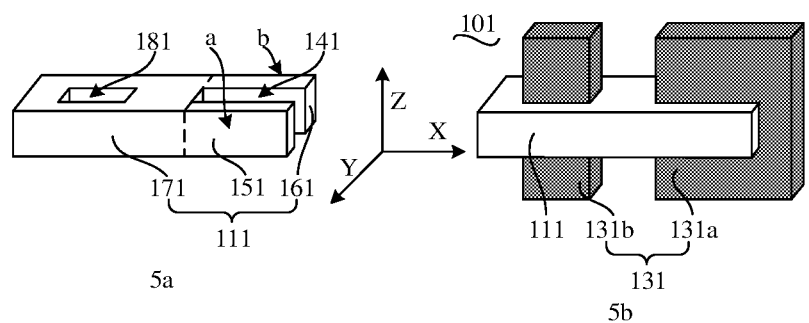
FIG. 5 to FIG. 7 are another five partial three-dimensional schematic diagrams of a capacitor structure in a semiconductor structure according to an embodiment of the disclosure.
Figure 6:
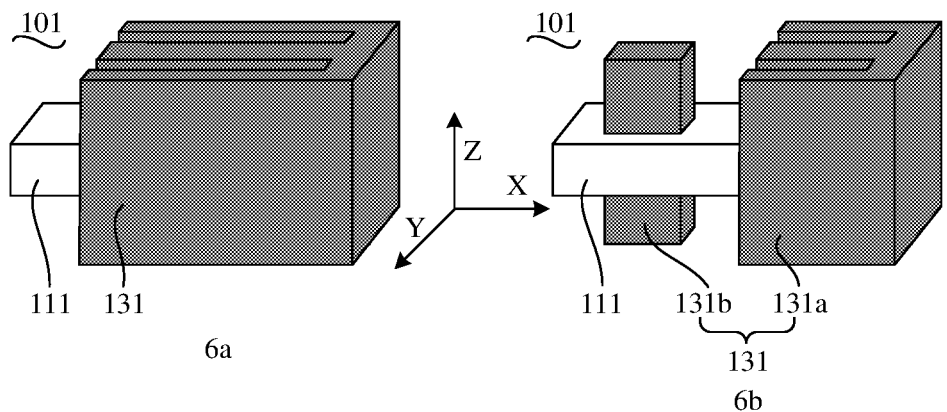
Figure 7:
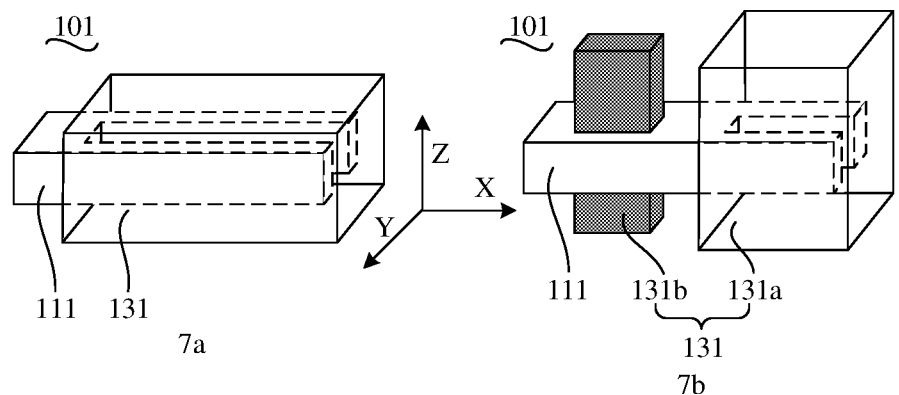
Figure 8:
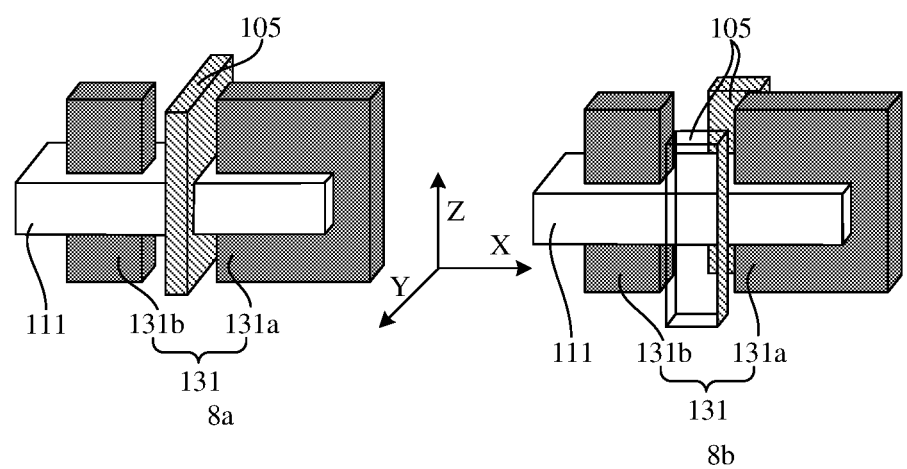
FIG. 8 is two partial three-dimensional schematic diagrams of a capacitor structure and a supporting layer in a semiconductor structure according to an embodiment of the disclosure.
Figure 9:
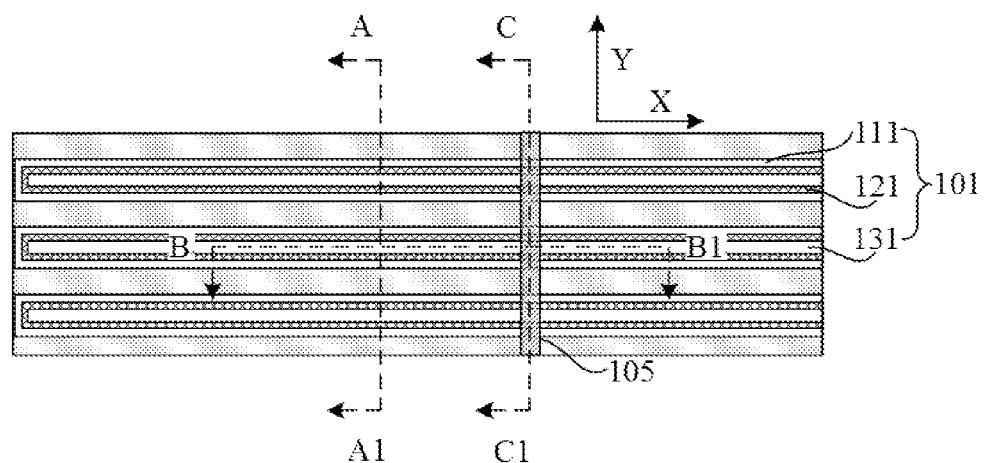
FIG. 9 is a schematic top view of a semiconductor structure according to an embodiment of the disclosure.
Figure 10:
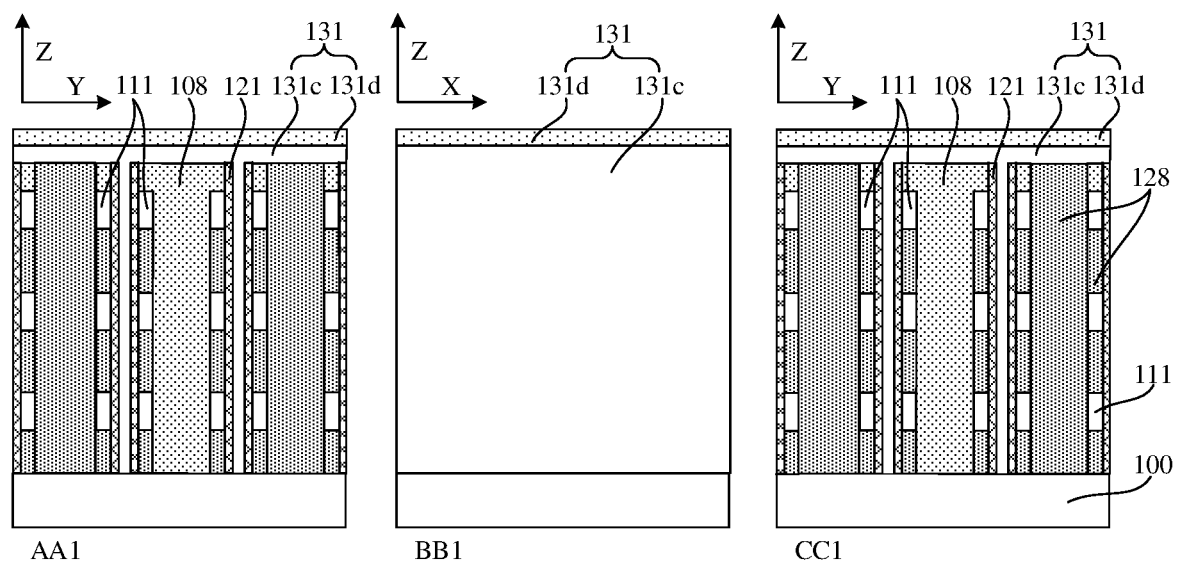
FIG. 10 is a partial sectional diagram of the semiconductor structure shown in FIG. 9 taken along a first sectional direction AA1, a second sectional direction BB1 and a third sectional direction CC1.

An embodiment of the disclosure provides a semiconductor structure. The semiconductor structure provided by an embodiment of the disclosure will be described in detail below in combination with the accompanying drawings. FIG. 1 to FIG. 4 are four partial three-dimensional schematic diagrams of a semiconductor structure according to an embodiment of the disclosure. FIG. 5 to FIG. 7 are another five partial three-dimensional schematic diagrams of a capacitor structure in a semiconductor structure according to an embodiment of the disclosure. FIG. 8 is two partial three-dimensional schematic diagrams of a capacitor structure and a supporting layer in a semiconductor structure according to an embodiment of the disclosure. FIG. 9 is a schematic top view of a semiconductor structure according to an embodiment of the disclosure. FIG. 10 is a partial sectional diagram of the semiconductor structure shown in FIG. 9 taken along a first sectional direction AA1, a second sectional direction BB1 and a third sectional direction CC1.

With reference to FIG. 1 to FIG. 10, the semiconductor structure includes: a substrate 100; and a plurality of capacitor structures 101 arranged on a surface of the substrate 100. Each of the plurality of capacitor structures 101 extends in a first direction X. The first direction X is parallel to the surface of the substrate 100. Each of the plurality of capacitor structures 101 includes a lower electrode layer 111, a capacitor dielectric layer 121 and an upper electrode layer 131. The lower electrode layer 131 is provided with a U-shaped groove 141. The U-shaped groove 141 is at least completely filled with the capacitor dielectric layer 121 and the upper electrode layer 131. The capacitor dielectric layer 121 is arranged between the lower electrode layer 111 and the upper electrode layer 131.

It can be understood that the sidewalls, which form the U-shaped groove 141, of the lower electrode layer 111 directly face toward the upper electrode layer 131, so as to increase the direct-facing area between the upper electrode layer 131 and the lower electrode layer 111. Furthermore, in a direction perpendicular to the surface of the substrate 100, the upper electrode layer 131 is arranged in the lower electrode layer 111, which contributes to reducing the overall layout area occupied by the upper electrode layer 131, without increasing the width of the lower electrode layer 111.

It should be noted that in order to clearly show the characteristics of the capacitor structure provided by an embodiment of the disclosure, FIG. 1 to FIG. 8 only illustrate the lower electrode layer 111 and the upper electrode layer 131 in the capacitor structure 101, and the capacitor dielectric layer 121 (with reference to FIG. 10) is not shown. The capacitor dielectric layer 121 is at least arranged in the gap directly facing toward the upper electrode layer 131 and the lower electrode layer 111. The dielectric layer for isolating adjacent same structures is not shown in FIG. 1 to FIG. 8.

The embodiments of the disclosure will be described in detail below in combination with the accompanying drawings.

The layouts between other components and the capacitor structures in the semiconductor structure at least include the three following embodiments.

Figure 1:
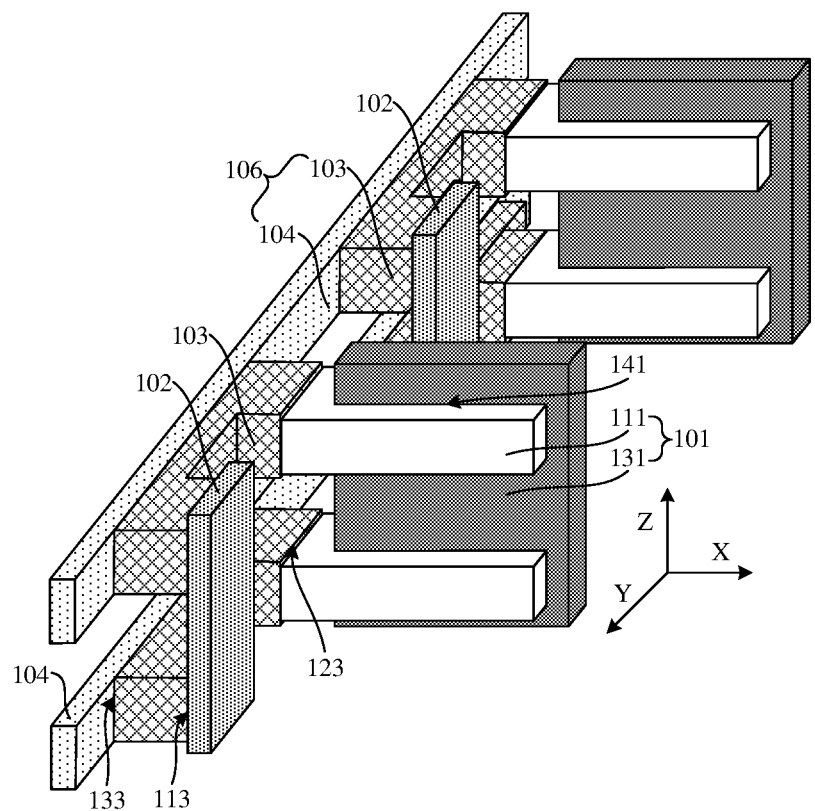
FIG. 1 to FIG. 4 are four partial three-dimensional schematic diagrams of a semiconductor structure according to an embodiment of the disclosure.
Figure 2:
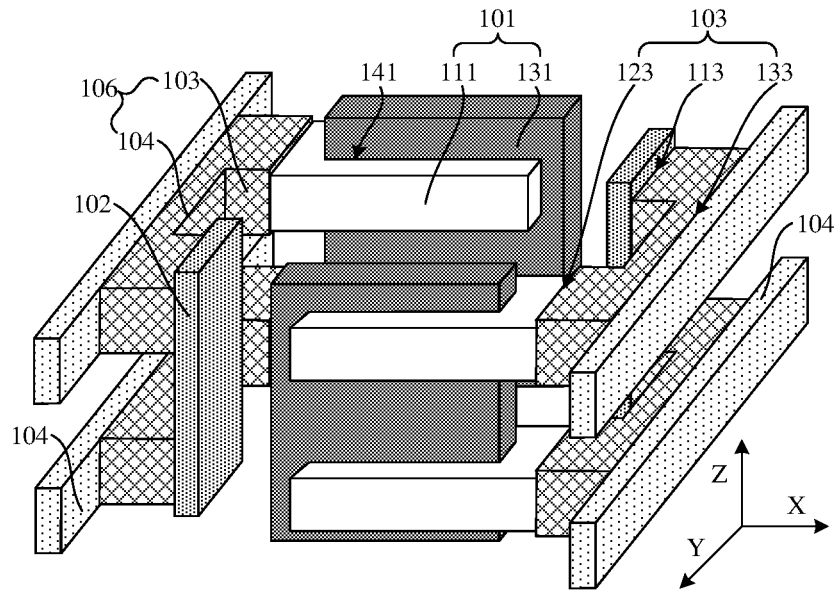

In some embodiments, with reference to FIG. 1 and FIG. 2, the semiconductor structure may further include a plurality of bit lines 102 and a plurality of transistor structures 106. Each of the plurality of transistor structures 106 may include a semiconductor channel 103 and a gate structure 104. A cross-section of the semiconductor channel 103 parallel to the surface of the substrate 100 (with reference to FIG. 10) is U-shaped. The semiconductor channel 103 is provided with a first end 113, a second end 123, and a third end 133. The first end 113 is arranged on a same side as the second end 123, and the third end 133 is arranged opposite to the first end 113. One of the first end 113 and the second end 123 is in contact with a respective one of the plurality of bit lines 102, and the other one of the first end 113 and the second end 123 is in contact with the lower electrode layer 111, and the third end 133 is in contact with the gate structure 104. In this way, the bit line 102 and the capacitor structure 101 may be arranged on the same side of the semiconductor channel 103. For example, the bit line 102 and the capacitor structure 101 may be arranged on the same side of the semiconductor channel 103 in the first direction X. In a case that the semiconductor channel 103 extends in a second direction Y, the bit line 102 and the capacitor structure 101 are prevented from being arranged on two sides of the semiconductor channel 103 in the second direction Y, which contributes to reducing the overall layout length of the semiconductor structure in the second direction Y. Furthermore, it contributes to designing a plurality of semiconductor channels 103 arrayed in the second direction Y and spaced apart from each other, thereby improving the layout diversity of the semiconductor channels 103.

It should be noted that, as an example, in FIG. 1, there are two semiconductor channels 103 arrayed in the second direction Y and spaced apart from each other, and the two semiconductor channels 103 arrayed in the second direction Y and spaced apart from each other correspond to the same gate structure 104. In the actual application, the number of the semiconductor channels 103 arrayed in the second direction Y and spaced apart from each other is not limited.

In some embodiments, with reference to FIG. 2, two capacitor structures 101, which are arranged adjacent to each other in the first direction X and electrically connected to two respective gate structures 104, directly face toward each other.

It should be understood that in the first direction X, in order to achieve the higher capacitance, the lower electrode layer 111 has a longer length, while the bit line 102 does not need to have a longer length. Thus, the length of the bit line is generally much shorter than that of the lower electrode layer 111. For a storage structure including a single capacitor structure 101, a single semiconductor channel 103 and a single bit line 102, there is still a portion of layout space in the first direction X that is not utilized. Therefore, the two capacitor structures 101, which are arranged adjacent to each other in the first direction X and electrically connected to different gate structures 104, directly face toward each other. That is, for a plane perpendicular to the second direction Y, the orthographic projections of the two capacitor structures 101 of different storage structures coincide with each other in this plane, or most of the orthographic projections of the two capacitor structures 101 of different storage structures coincide with each other in this plane, which contributes to fully utilizing the shape characteristics of the storage structure, thereby improving the integration density of the storage structures in the semiconductor structure.

It should be noted that, as an example, in FIG. 1 and FIG. 2, there are two semiconductor channels 103 arrayed in the third direction Z and spaced apart from each other, and the two semiconductor channels 103 arrayed in the third direction Z and spaced apart from each other correspond to the same bit line 102. In the actual application, the number of the semiconductor channels 103 arrayed in the third direction Z and spaced apart from each other is not limited. In addition, as an example, in FIG. 1 and FIG. 2, the first end 113 is in contact with the bit line 102, and the second end 123 is in contact with the lower electrode layer 111. In the actual application, the first end 113 may be in contact with the lower electrode layer 111, and the second end 123 may be in contact with the bit line 102.

In addition, with reference to FIG. 1 and FIG. 2, for a single transistor structure 106, the single transistor structure 106 includes a single semiconductor channel 103 and a gate structure 104, a portion of the gate structure 104 being in contact with the third end 133.

Figure 3:
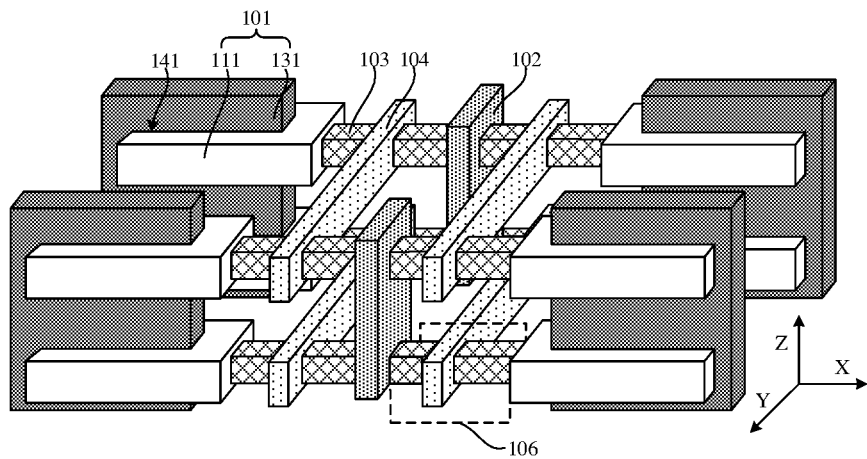
Figure 4:
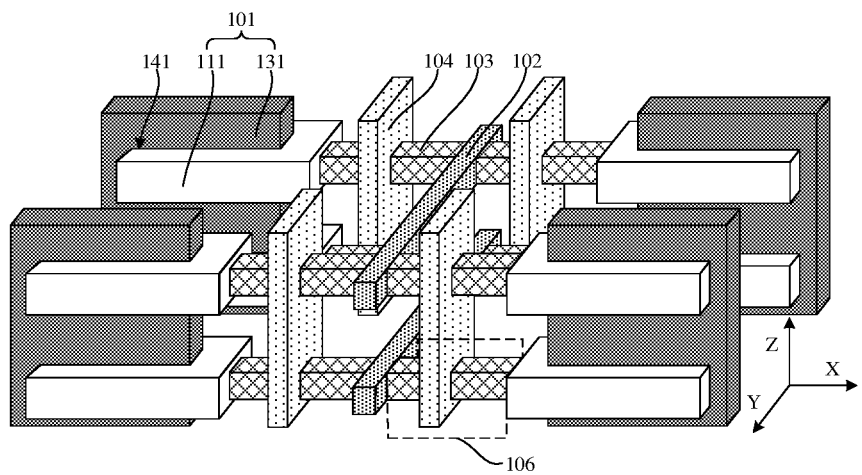

In some other embodiments, with reference to FIG. 3 and FIG. 4, the semiconductor structure may further include a plurality of semiconductor channels 103, a plurality of gate structures 104 and a plurality of bit lines 102. A respective one of the gate structures 104 and a respective one of the bit lines 102 are connected to the semiconductor channels 103. A respective one of the semiconductor channels 103 and a respective one of the plurality of capacitor structures 101 are arrayed in the first direction X. The gate structure 104 is arranged around a portion of each sidewall of the semiconductor channel 103 extending in the first direction X. The plurality of capacitor structures 101 are arranged in an array in the second direction Y and in the third direction Z. The capacitor structures 101 are electrically connected to the semiconductor channels 103 in a one-to-one correspondence manner. The first direction X, the second direction Y and the third direction Y intersect with each other.

In an example, with reference to FIG. 3, the gate structure 104 extends in the second direction Y, and the bit line 102 extends in the third direction Z. It can be understood that the bit lines 102 may be arrayed in the second direction Y and spaced apart from each other. That is, the plurality of lower electrode layers 111 arrayed in the second direction Y and spaced apart from each other correspond to different bit lines 102, and the plurality of lower electrode layers 111 arrayed in the second direction Y and spaced apart from each other correspond to the same gate structure 104. In this way, it contributes to reducing the complexity of controlling the plurality of memory cells in the semiconductor structure, while improving the integration density of the gate structures 104, the bit lines 102 and the capacitor structures 101 in the semiconductor structure.

In another example, with reference to FIG. 4, the gate structure 104 extends in the third direction Z, and the bit line 102 extends in the second direction Y. It can be understood that, the bit lines 102 may be arrayed in the third direction Z and spaced apart from each other. That is, the plurality of lower electrode layers 111 arrayed in the third direction Z and spaced apart from each other correspond to different bit lines 102, and the plurality of lower electrode layers 111 arrayed in the third direction Z and spaced apart from each other correspond to the same gate structure 104. In this way, it contributes to reducing the complexity of controlling the plurality of memory cells in the semiconductor structure, while improving the integration density of the gate structures 104, the bit lines 102 and the capacitor structures 101 in the semiconductor structure.

In the above two embodiments, the semiconductor channel 103 is provided with two opposite ends in the first direction X. One of the two ends is in contact with the bit line 102, and the other end is in contact with the lower electrode layer 111 in the capacitor structure 101. The bit line 102 is provided with two opposite sides in the first direction X, and these two sides are respectively in contact with different semiconductor channels 103. Furthermore, the gate structure 104 is arranged around the semiconductor channel 103. It can be understood that, in the first direction X, the semiconductor channel 103 includes a source area, a channel area and a drain area, which are sequentially arranged. The gate structure 104 is arranged around sidewalls of the channel area extending in the first direction X, and the gate structure 104 includes a gate dielectric layer and a gate, which are arranged around the channel area. The gate dielectric layer may only be arranged around the channel area, that is, the gate dielectric layers correspond to the semiconductor channels 103 in a one-to-one correspondence manner. The gate extends in the second direction Y or the third direction Z, that is, the gate may correspond to the plurality of semiconductor channels 103, so that the entire gate structure 104 extends in the second direction Y or the third direction Z.

In some embodiments, with reference to FIG. 3 and FIG. 4, the plurality of capacitor structures 101 are arrayed in the third direction Z and in the second direction Y. In the actual application, the capacitor structures 101 may be only arrayed in the third direction Z or may be only arrayed in the second direction Y.

In some embodiments, the number of the capacitor structures 101 is determined by the number of the lower electrode layers 111. The plurality of capacitor structures 101 may share the capacitor dielectric layer 121 (with reference to FIG. 9) and the upper electrode layer 131. In the actual application, the capacitor dielectric layers 121 may only correspond to the lower electrode layers 111 in a one-to-one correspondence manner, or the upper electrode layers 131 may only correspond to the lower electrode layers 111 in a one-to-one correspondence manner.

It should be noted that FIG. 9 illustrates the capacitor dielectric layer 121 and the lower electrode layer 111 covered by the upper electrode layer 131 in a perspective manner.

The capacitor structure 101 will be described in detail below in combination with FIG. 1 to FIG. 8.

In some embodiments, with reference to FIG. 1 to FIG. 4, the upper electrode layer 131 is provided with the U-shaped groove 141, and the U-shaped groove 141 is completely filled with both the capacitor dielectric layer 121 and the upper electrode layer 131.

In some other embodiments, with reference to FIG. 5, the lower electrode layer 111 may include a first region 171, a second region 151 and a third region 161. The second region 151 and the third region 161 are arranged opposite to each other in the second direction Y, and the first region 171 is in contact with the second region 151 and the third region 161. The second region 151, the third region 161 and the first region 171 collectively form the U-shaped groove 141. The lower electrode layer 111 may further include a through hole 181. The through hole 181 is arranged in the first region 171 of the lower electrode layer 111, and the through hole 181 is at least completely filled with the capacitor dielectric layer 121 and the upper electrode layer 131. In this way, it contributes to increasing the surface area of the lower electrode layer 111 exposed outside without changing the overall layout space of the lower electrode layer 111 in the semiconductor structure, so that it contributes to increasing the direct-facing area between the upper electrode layer 131 and the lower electrode layer 111, thereby improving the capacitance of the capacitor structure 101. Therefore, it contributes to further improving the capacitance of the capacitor structure 101, while guaranteeing the higher integration density of the capacitor structures 101 in the semiconductor structure.

In some other embodiments, with reference to FIG. 5 and FIG. 6, the lower electrode layer 111 may include a first region 171, a second region 151 and a third region 161. The second region 151 and the third region 161 are arranged opposite to each other in the second direction Y, and the first region 171 is in contact with the second region 151 and the third region 161. The second region 151, the third region 161 and the first region 171 collectively form the U-shaped groove 141. In the second direction Y, the second region 151 is provided with a first sidewall a away from the U-shaped groove 141, the third region 161 is provided with a second sidewall b away from the U-shaped groove 141. The capacitor dielectric layer 121 (with reference to FIG. 10) is further arranged on the first sidewall a and the second sidewall b. The upper electrode layer 131 is further arranged on a side of the capacitor dielectric layer 121 away from the first sidewall a, and the upper electrode layer 131 is further arranged on a side of the capacitor dielectric layer 121 away from the second sidewall b.

It should be noted that in an example, with reference to 6a in FIG. 6, the lower electrode layer 111 is only provided with the U-shaped groove 141 (with reference to FIG. 5). The upper electrode layer 131 is further arranged on the first sidewall a and the second sidewall b, while the U-shaped groove 141 is completely filled with the capacitor dielectric layer 121 (with reference to FIG. 10) and the upper electrode layer 131. In this way, the upper electrode layer 131 not only directly faces to the sidewalls, which are configured for forming the U-shaped groove 141, of the lower electrode layer 111, but also directly faces to the first sidewall a and the second sidewall b, which contributes to further increasing the direct-facing area between the upper electrode layer 131 and the lower electrode layer 111, without changing the layout space of the lower electrode layer 111 in the semiconductor structure, thereby improving the capacitance of the capacitor structure 101.

In another example, with reference to 6b in FIG. 6, the lower electrode layer 111 is not only provided with the U-shaped groove 141 (with reference to FIG. 5), but also provided with the through hole 181 (with reference to FIG. 5). The U-shaped groove 141 and the through hole 181 are completely filled with the capacitor dielectric layer 121 (with reference to FIG. 10) and the upper electrode layer 131, and the upper electrode layer 131 is further arranged on the first sidewall a and the second sidewall b. In this way, the upper electrode layer 131 not only directly faces to the sidewalls, which are configured for forming the U-shaped groove 141, of the lower electrode layer 111, but also directly faces to the first sidewall a and the second sidewall b, and further directly faces to the sidewalls, which are configured for forming the through hole 181, of the lower electrode layer 111, which contributes to further increasing the direct-facing area between the upper electrode layer 131 and the lower electrode layer 111, without changing the layout space of the lower electrode layer 111 in the semiconductor structure, thereby improving the capacitance of the capacitor structure 101.

In some other embodiments, with reference to FIG. 5 and FIG. 7, the lower electrode layer 111 may include a first region 171, a second region 151 and a third region 161. The second region 151 and the third region 161 are arranged opposite to each other in the second direction Y, and the first region 171 is in contact with the second region 151 and the third region 161. The second region 151, the third region 161 and the first region 171 collectively form the U-shaped groove 141. The capacitor dielectric layer 121 (with reference to FIG. 10) is arranged around sidewalls, which extend in the first direction X, of the second region 151, the capacitor dielectric layer 121 is arranged around sidewalls, which extend in the first direction X, of the third region 161, and the upper electrode layer 131 covers sidewalls, which extend in the first direction X, of the capacitor dielectric layer 121.

It should be noted that in an example, with reference to 7a in FIG. 7, the lower electrode layer 111 is only provided with the U-shaped groove 141 (with reference to FIG. 5). Four sidewalls, which extend in the first direction X, of the second region 151 directly face toward the upper electrode layer 131, and four sidewalls, which extend in the first direction X, of the third region 161 directly face toward the upper electrode layer 131. In this way, the upper electrode layer 131 not only directly faces to sidewalls, which are configured for forming the U-shaped groove 141, of the lower electrode layer 111, but also directly faces to other sidewalls, which extend in the first direction X, of the second region 151, and other sidewalls, which extend in the first direction X, of the third region 161, which contributes to further increasing the direct-facing area between the upper electrode layer 131 and the lower electrode layer 111, without changing the layout space of the lower electrode layer 111 in the semiconductor structure, thereby improving the capacitance of the capacitor structure 101.

In another example, with reference to 7b in FIG. 7, the lower electrode layer 111 is not only provided with the U-shaped groove 141 (with reference to FIG. 5), but also provided with the through hole 181 (with reference to FIG. 5). Four sidewalls, which extend in the first direction X, of the second region 151 directly face toward the upper electrode layer 131, four sidewalls, which extend in the first direction X, of the third region 161 directly face toward the upper electrode layer 131, and sidewalls, which are configured for forming the through hole 181, of the lower electrode layer 111 directly faces to the upper electrode layer 131. In this way, the upper electrode layer 131 not only directly faces to the sidewalls, which extend in the first direction X, of the second region 151, and the sidewalls, which extend in the first direction X, of the third region 161, but also directly faces to the sidewalls, which are configured for forming the through hole 181, of the lower electrode layer 131, which contributes to further increasing the direct-facing area between the upper electrode layer 131 and the lower electrode layer 111, without changing the layout space of the lower electrode layer 111 in the semiconductor structure, thereby improving the capacitance of the capacitor structure 101.

In various aforementioned embodiments, in the second direction Y, a ratio of a width of the U-shaped groove 141 to a maximum width of the lower electrode layer 111 may be greater than or equal to ½. It can be understood that, in the second direction Y, the maximum width of the lower electrode layer 111 may be a width of the first region 171, and the width of the U-shaped groove 141 is greater than or equal to ½ of the width of the first region 171, which contributes to forming the U-shaped groove 141 with a sufficient width, thereby facilitating sequentially forming the capacitor dielectric layer 121 and the upper electrode layer 131 in the U-shaped groove 141.

It should be noted that, in various aforementioned embodiments, in a case that the lower electrode layer 111 is not only provided with the U-shaped groove 141, but also provided with the through hole 181, the upper electrode layer 131 includes a first upper electrode layer 131a and a second upper electrode layer 131b. The first upper electrode layer 131a corresponds to the U-shaped groove 141, and the second upper electrode layer 131b corresponds to the through hole 181. That is, the first upper electrode layer 131a directly faces to a portion of each sidewall, which extends in the first direction X, of the second region 151 and the third region 161, and the second upper electrode layer 131b directly faces to the sidewalls, which are configured for forming the through hole 181, of the lower electrode layer 111. In addition, a conductive layer may be in contact with each of the first upper electrode layer 131a and the second upper electrode layer 131b, so as to realize the electrical connection between the first upper electrode layer 131a and the second upper electrode layer 131b.

In some embodiments, in the first direction X, the distance between the first upper electrode layer 131a and the second upper electrode layer 131b is less than or equal to 1/10 of the length of the lower electrode layer 111, so as to avoid the distance between the first upper electrode layer 131a and the second upper electrode layer 131b from being too long, which contributes to increasing the length of the U-shaped groove 141 in the first direction X, thereby increasing the direct-facing area between the first upper electrode layer 131a and the lower electrode layer 111.

It should be noted that, in order to clearly show the positional relationship between the U-shaped groove 141 and the upper electrode layer 131, at least a portion of the upper electrode layer 131 is represented in a perspective manner in FIG. 8.

In some embodiments, with reference to FIG. 10, the upper electrode layer 131 may be of a double-layered structure. Specifically, the upper electrode layer 131 may include a diffusion barrier layer 131c covering a surface of the capacitor dielectric layer 121 away from the lower electrode layer 111, and a conductive layer 131d covering a surface of the diffusion barrier layer 131c. The diffusion barrier layer 131c contributes to preventing a conductive material in the conductive layer 131d from being diffused into the capacitor dielectric layer 121, so as to guarantee the good insulating performance of the capacitor dielectric layer 121 and the good conductive performance of the conductive layer 131d. In an example, a material of the diffusion barrier layer 131c may be titanium nitride or titanium oxide. A material of the conductive layer 131d may be polycrystalline silicon. A material of the capacitor dielectric layer 121 may be a high dielectric constant material including an oxide or an oxynitride containing at least one of hafnium, ruthenium, zirconium, or tantalum. Alternatively, a material of the capacitor dielectric layer 121 may be a high dielectric constant material including an oxide or an oxynitride containing at least one of hafnium, ruthenium, zirconium or tantalum and containing silicon.

In some embodiments, with reference to FIG. 8, the semiconductor structure may further include a supporting layer 105. The supporting layer 105 is arranged on a portion of each sidewall, which extends in the first direction X, of the lower electrode layer 111. It should be noted that in a case that the lower electrode layer 111 is provided with the U-shaped groove 141 (with reference to FIG. 5) and the through hole 181 (with reference to FIG. 5), the supporting layer 105 is at least arranged between the first upper electrode layer 131a and the second upper electrode layer 131b. As an example, in FIG. 8, the supporting layer 105 is arranged between the first upper electrode layer 131a and the second upper electrode layer 131b. In the actual application, the supporting layer 105 may further be arranged on a side of the first upper electrode layer 131a away from the second upper electrode layer 131b, or arranged in the first upper electrode layer 131a and the second upper electrode layer 131b. It can be understood that the positional relationship between the supporting layer 105 and the upper electrode layer 131 is not limited in an embodiment of the disclosure, as long as the supporting layer 105 is in contact with a portion of each sidewall of the lower electrode layer 111.

It can be understood that since the demand for the capacitor structure 101 with high capacitance is increased, the layout length of the capacitor structure 101 in the first direction X is larger. The supporting layer 105 is added in the semiconductor structure, so that the supporting layer 105 is arranged around a portion of each sidewall, which extends in the first direction X, of the lower electrode layer 111, so as to fix and support the capacitor structure 101 with the larger length, and to avoid collapse of the capacitor structure 101, thereby improving the stability of the semiconductor structure.

It should be noted that in order to clearly show the positional relationship between the U-shaped groove 141 and the upper electrode layer 131, at least a portion of the upper electrode layer 131 is represented in a perspective manner in FIG. 8. The semiconductor structure shown in FIG. 9 and FIG. 10 does not include the supporting layer 105. The sectional views taken along the first sectional direction AA1 and the third sectional direction CC1 in FIG. 10 correspond to the U-shaped groove 141, and the sectional view taken along the second sectional direction BB1 illustrates the upper electrode layer 131 in the U-shaped groove 141.

The relative positional relationship between the supporting layer 105 and the lower electrode layer 111 at least includes the two following embodiments.

In some embodiments, with reference to 8a in FIG. 8, the lower electrode layer 111 is provided with a contact region (not shown in the figure) in contact with the supporting layer 105. The supporting layer 105 is arranged around all sidewalls, which extend in the first direction X, of the contact region. It can be understood that the lower electrode layer 111 shown in 8a in FIG. 8 is provided with four sidewalls extending in the first direction X, and the supporting layer 105 being arranged around all sidewalls, which extend in the first direction X, of the contact region means that the supporting layer 105 is arranged around four sidewalls, which extend in the first direction X, of the contact region.

In some other embodiments, with reference to 8b in FIG. 8, the lower electrode layer 111 is provided with the contact region (not shown in the figure) in contact with the supporting layer 105. In the second direction Y, the contact region is provided with a third sidewall (not shown in the figure) and a fourth sidewall (not shown in the figure) opposite to each other. In the third direction Z, the contact region is provided with a fifth sidewall (not shown in the figure) and a sixth sidewall (not shown in the figure) opposite to each other. The supporting layer 105 is arranged on the third sidewall and the fourth sidewall, and the capacitor dielectric layer 121 (with reference to FIG. 10) and the upper electrode layer 131 are arranged on the fifth sidewall and the sixth sidewall.

It should be noted that, for the sake of description, as an example, in FIG. 8, the lower electrode layer 111 is a cuboid. In the actual application, the lower electrode layer 111 may also be a cylinder.

In an example, in a direction perpendicular to the first direction X, a thickness of the lower electrode layer 111 may range from 4 nm to 50 nm. An overall thickness of the capacitor structure 101 may range from 10 nm to 70 nm. In the first direction X, an overall length of the capacitor structure 101 may range from 200 nm to 1500 nm.

In some embodiments, with reference to FIG. 10, the semiconductor structure may further include a dielectric layer 108 and an isolation layer 128. The dielectric layer 108 may be arranged between portions of the lower electrode layers 111 arranged adjacent to each other in the second direction Y. The isolation layer 128 may be arranged between remaining portions of the lower electrode layers 111 arranged adjacent to each other in the second direction Y. The dielectric layer 108 and the isolation layer 128 collectively provide an electric insulation between the lower electrode layers 111 arranged adjacent to each other in the second direction Y. In addition, the isolation layer 128 may further be arranged between the lower electrode layers 111 arranged adjacent to each other in the third direction Z, so as to provide an electric insulation between the lower electrode layers 111 arranged adjacent to each other in the third direction Z. The dielectric layer 108 and the isolation layer 128 may be made of a same insulating material or different insulating materials.

It should be noted that, as an example, in FIG. 1 to FIG. 4, FIG. 9 and FIG. 10, the lower electrode layers 111 are not only arrayed in the second direction Y and spaced apart from each other, but also arrayed in the third direction Z and spaced apart from each other. In the actual application, the lower electrode layers 111 may only be arrayed in the second direction Y and spaced apart from each other, or may only be arrayed in the third direction Z and spaced apart from each other. In addition, as an example, in FIG. 10, the isolation layer 128 includes a multi-layer structure. In the actual application, the isolation layer 128 may be an integrally formed structure.

Overall, the sidewalls, which form the U-shaped groove 141, of the lower electrode layer 111 all directly face toward the upper electrode layer 131, which contributes to increasing the direct-facing area between the upper electrode layer 131 and the lower electrode layer 111. Furthermore, in the second direction Y, the upper electrode layer 131 is arranged in the lower electrode layer 111, which contributes to reducing the overall layout area occupied by the upper electrode layer 131, without increasing the width of the lower electrode layer 111. Therefore, it contributes to improving the integration density of the capacitor structures 101 in the semiconductor structure, while improving the capacitance of the capacitor structure 101.

Another embodiment of the disclosure further provides a method for manufacturing a semiconductor structure, which is used for manufacturing the semiconductor structure provided in the above embodiments. The method for manufacturing the semiconductor structure provided by another embodiment of the disclosure will be described in detail below in combination with the FIG. 1 to FIG. 34. FIG. 11 to FIG. 34 are partial sectional diagrams corresponding to various operations in a method for manufacturing a semiconductor structure according to another embodiment of the disclosure. It should be noted that the parts identical to or corresponding to the aforementioned embodiments are not repeated herein.

It should be noted that, expect for FIG. 14, FIG. 25 and FIG. 33, FIG. 11 to FIG. 34 are partial sectional diagrams of a semiconductor structure taken along the first sectional direction AA1, the second sectional direction BB1 and the third sectional direction CC1. FIG. 14 is a schematic top view of a first mask layer in a method for manufacturing a semiconductor structure shown in FIG. 13. FIG. 25 is a schematic top view of a second mask layer in a method for manufacturing a semiconductor structure shown in FIG. 24. FIG. 33 is a schematic top view of a third mask layer in a method for manufacturing a semiconductor structure shown in FIG. 32.

With reference to FIG. 11 to FIG. 34, the method for manufacturing the semiconductor structure includes the following operations. A substrate 100 is provided. A plurality of capacitor structures 101 are formed on a surface of the substrate 100, in which each of the plurality of capacitor structures 101 extends in a first direction X, and the first direction X is parallel to the surface of the substrate 100. Each of the plurality of capacitor structures 101 includes a lower electrode layer 111, a capacitor dielectric layer 121 and an upper electrode layer 131. The lower electrode layer 111 is provided with a U-shaped groove 141. The U-shaped groove 141 is at least completely filled with the capacitor dielectric layer 121 and the upper electrode layer 131. The capacitor dielectric layer 121 is arranged between the lower electrode layer 111 and the upper electrode layer 131. In this way, it contributes to increasing the direct-facing area between the lower electrode layer 111 and the upper electrode layer 131, without increasing the width of the lower electrode layer 111 in the second direction Y.

In some embodiments, with reference to FIG. 1 and FIG. 2, the method may further include the following operation. A bit line 102 and a transistor structure 106 are formed, in which the transistor structure 106 may include a semiconductor channel 103 and a gate structure 104. The operation that the transistor structure 106 is formed may include the following operations. The semiconductor channel 103 is formed, in which a cross-section of the semiconductor channel 103 parallel to the surface of the substrate 100 is U-shaped, the semiconductor channel 103 is provided with a first end 113, a second end 123 and a third end 133, in which the first end 113 is arranged on a same side as the second end 123, the third end 133 is arranged opposite to the first end 113, one of the first end 113 and the second end 123 is in contact with the bit line 102, and the other one of the first end 113 and the second end 123 is in contact with the lower electrode layer 111. The gate structure 104 is formed at the third end 133.

In some other embodiments, with reference to FIG. 3 and FIG. 4, the method for manufacturing the semiconductor structure may further include the following operations. The semiconductor channels 103 arranged in an array in the second direction Y and in the third direction Z are formed. The gate structure 104 and the bit line 102 connected to the semiconductor channel 103 are formed, in which the gate structure 104 is arranged around a portion of each sidewall, which extends in the first direction X, of the semiconductor channel 103.

It should be noted that the layout of the gate structure 104, the bit line 102 and the semiconductor channel 103 at least includes the two following embodiments. In some embodiments, with reference to FIG. 3, the gate structure 104 extends in the second direction Y, and the bit line 102 extends in the third direction Z. In some other embodiments, with reference to FIG. 4, the gate structure 104 extends in the third direction Z, and the bit line 102 extends in the second direction Y.

It should be noted that the forming sequence and the specific forming method of the gate structure 104, the bit line 102 and the semiconductor channel 103 are not limited in the embodiments of the disclosure.

In some embodiments, the operation that the plurality of capacitor structures 101 are formed may include the following operation. The plurality of capacitor structures 101 arrayed in the third direction Z and the plurality of capacitor structures 101 arrayed in the second direction Y and spaced apart from each other are formed. In an example, the capacitor structures 101 are electrically connected to the semiconductor channels 103 in a one-to-one correspondence manner. The plurality of capacitor structures 101 share the capacitor dielectric layer 121 and the upper electrode layer 131. The first direction X, the second direction Y and the third direction Y intersect with each other. In the actual application, through an etching process, the capacitor dielectric layers 121 may correspond to the lower electrode layers 111 one by one, and/or the upper electrode layers 131 may correspond to the lower electrode layers 111 one by one.

In some embodiments, the operation that a plurality of lower electrode layers 111 are formed may include the following operations.

Figure 11:
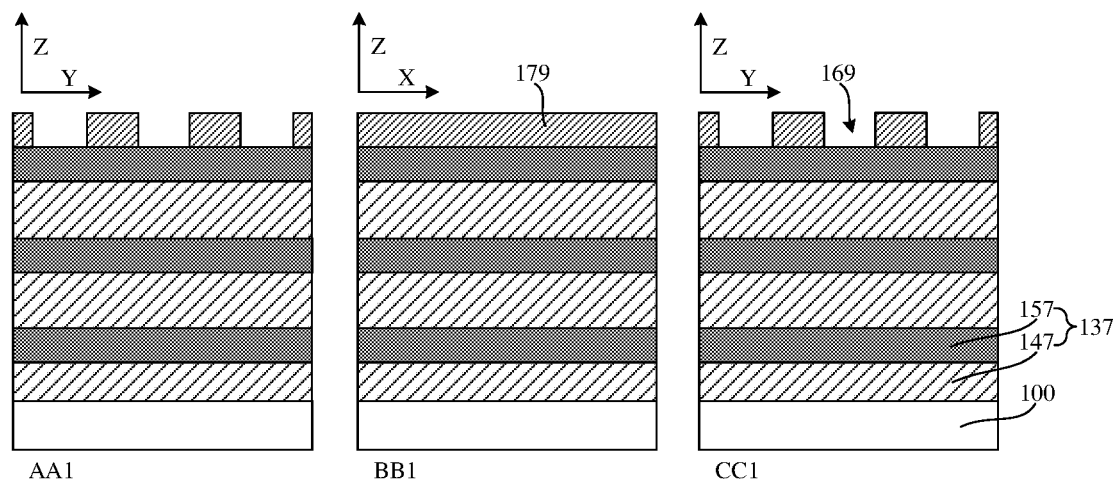
FIG. 11 to FIG. 34 are partial sectional diagrams corresponding to various operations in a method for manufacturing a semiconductor structure according to another embodiment of the disclosure.
Figure 12:
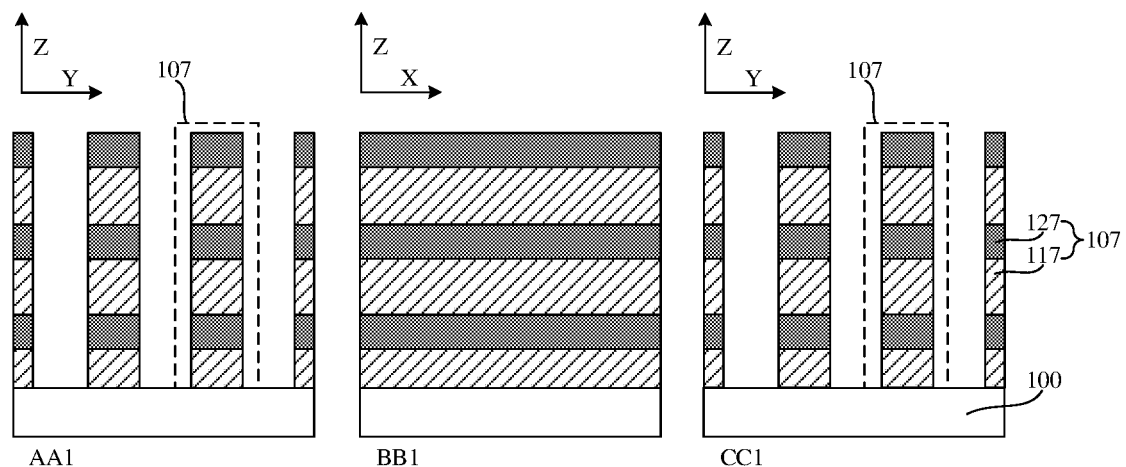

With reference to FIG. 11 and FIG. 12, the substrate 100 is provided. A plurality of semiconductor pillars 107 are formed on the substrate 100, in which the plurality of semiconductor pillars 107 are arrayed in the second direction Y and spaced apart from each other. Each of the plurality of semiconductor pillars 107 extends in the first direction X, each of the plurality of semiconductor pillars 107 includes a plurality of first semiconductor layers 117 and a plurality of second semiconductor layers 127, the plurality of first semiconductor layers 117 and the plurality of second semiconductor layers 127 being alternately stacked on one another in the third direction Z. The first direction X, the second direction Y and the third direction Z intersect with each other. In an example, a material of the first semiconductor layer 117 may be silicon germanium, a material of the second semiconductor layer 127 may be silicon, and the second semiconductor layer 127 may be doped with N-type ions or P-type ions. The N-type ions may be at least one of arsenic ions, phosphonium ions or antimony ions, and the P-type ions may be at least one of boron ions, indium ions or gallium ions.

In some embodiments, the operation that the plurality of semiconductor pillars 107 are formed may include the following operations. With reference to FIG. 11, a multi-layer stack structure 137 is formed on the substrate 100, in which the multi-layer stack structure 137 includes an initial first semiconductor layer 147 and an initial second semiconductor layer 157 arranged on a side of the initial first semiconductor layer 147 away from the substrate 100. With reference to FIG. 11 and FIG. 12, the multi-layer stack structure 137 is patterned to form the plurality of semiconductor pillars 107.

In some embodiments, the operation that the stack structure 137 is patterned may include the following operations. With reference to FIG. 11, a fourth mask layer 179 provided with a plurality of fourth openings 169 is formed on a top surface of the stack structure 137 away from the substrate 100, in which the plurality of fourth openings 169 extend in the first direction X and are arrayed in the second direction Y and spaced apart from each other. The stack structure 137 is etched through the plurality of fourth openings 169 by using the fourth mask layer 179 as a mask, so as to form the plurality of semiconductor pillars 107 arrayed in the second direction Y, spaced apart from each other and extending in the first direction X, in which each fourth opening 169 corresponds to a gap between any two adjacent semiconductor pillars 107.

It should be noted that the operation of forming the transistor structure 106 (with reference to FIG. 3) is performed after the plurality of semiconductor pillars 107 are formed. The specific process for forming the transistor structure 106 is not limited in the method provided by another embodiment of the disclosure. In addition, the operation that the bit line 102 is formed may be performed after the plurality of semiconductor pillars 107 are formed, or may be performed before the plurality of semiconductor pillars 107 are formed. The forming sequence of the bit line 102 and the semiconductor pillars 107 is not limited in the method provided by another embodiment of the disclosure.

Figure 13:
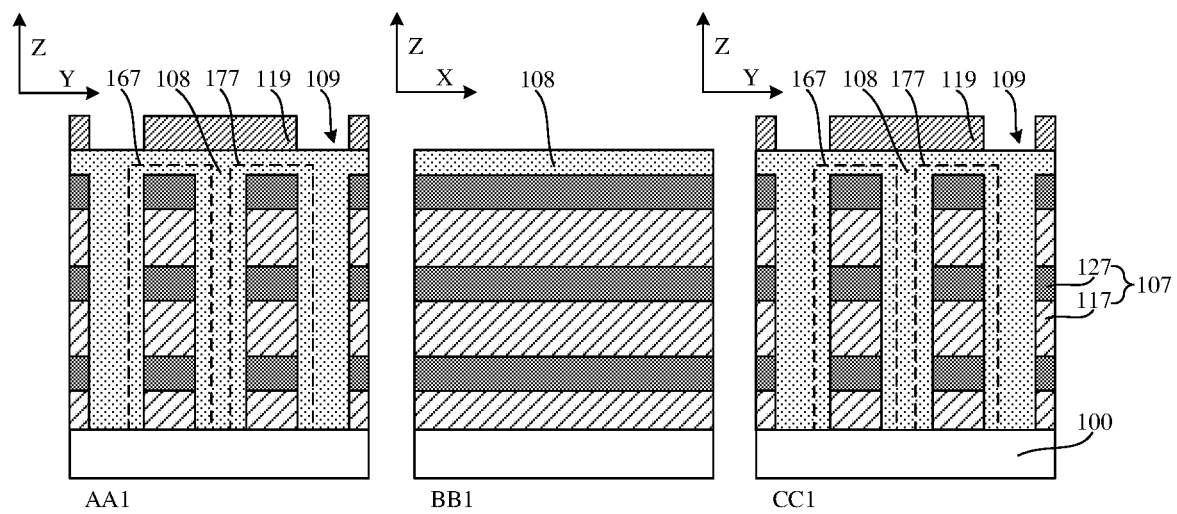
Figure 14:
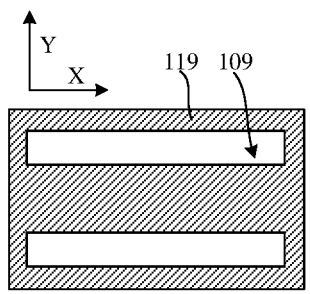

With reference to FIG. 13, the dielectric layer 108 is formed. The dielectric layer 108 at least completely fills gaps between any two adjacent semiconductor pillars 107. As an example, in FIG. 13, the dielectric layer 108 not only completely fills the gaps between any two adjacent semiconductor pillars 107, but also is arranged on top surfaces of the semiconductor pillars 107 away from the substrate 100, that is, a top surface of the dielectric layer 108 away from the substrate 100 is higher than the top surfaces of the semiconductor pillars 107 away from the substrate 100. In the actual application, the dielectric layer 108 may only completely fill the gaps between any two adjacent semiconductor pillars 107, that is, the top surface of the dielectric layer 108 away from the substrate 100 is flush with the top surfaces of the semiconductor pillars 107 away from the substrate 100. In an example, a material of the dielectric layer 108 may be silicon oxide.

With reference to FIG. 11 to FIG. 15, FIG. 24 to FIG. 26 and FIG. 32 to FIG. 34, the dielectric layer 108 is patterned. It should be noted that patterning the dielectric layer 108 aims to form a supporting structure for subsequently supporting the lower electrode layer 111 while exposing at least a portion of a sidewall, which extends in the third direction Z, of each semiconductor pillar 107. The supporting structure contributes to preventing the lower electrode layer 111 from collapsing in the subsequent operation of forming the capacitor structure 101. Hereinafter, the specific operation of patterning the dielectric layer 108 will be described in detail.

Figure 15:
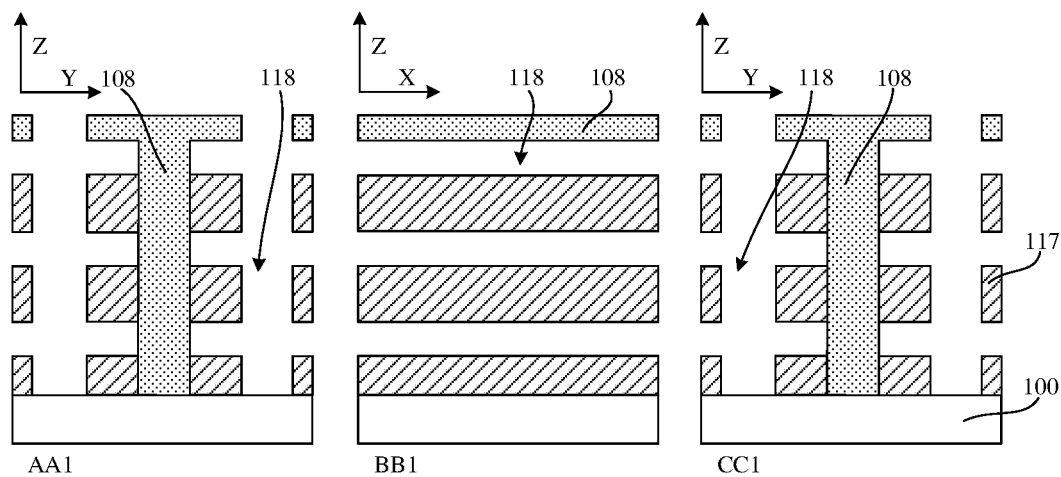

With reference to FIG. 13 to FIG. 15, portions of each of the plurality of second semiconductor layers 127 exposed by the dielectric layer 108 are etched to form a plurality of void structures 118.

Figure 16:
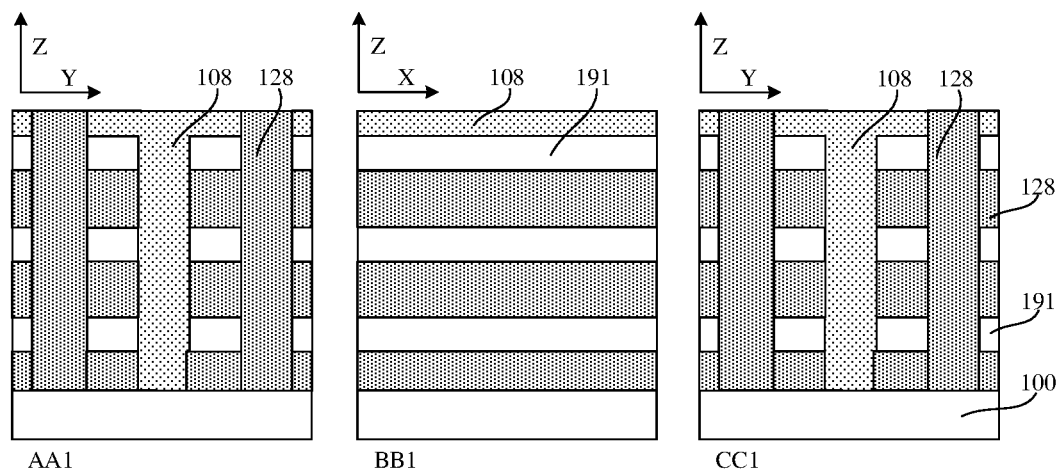

With reference to FIG. 15 and FIG. 16, an initial lower electrode layer 191 is formed in each of the plurality of void structures 118, in which a plurality of initial lower electrode layers 191 are arrayed in the second direction Y and in the third direction Z and spaced apart from each other.

In some embodiments, after the plurality of initial lower electrode layers 191 are formed, and before the plurality of initial lower electrode layers 191 are etched, the method for manufacturing the semiconductor structure may further include the following operations. With reference to FIG. 16, the plurality of first semiconductor layers 117 between any two initial lower electrode layers 191 adjacent to each other in the third direction Z are removed to form the isolation layer 128, in which the isolation layer 128 completely fill the remaining void structures 118, and completely fill the gaps between any two initial lower electrode layers 191 adjacent to each other in the third direction Z. It should be noted that the isolation layer 128 completely filling the gaps between any two initial lower electrode layers 191 adjacent to each other in the third direction Z, and the isolation layer 128 completely filling the remaining void structures 118 may be formed step by step, or may be integrally formed.

Figure 17:
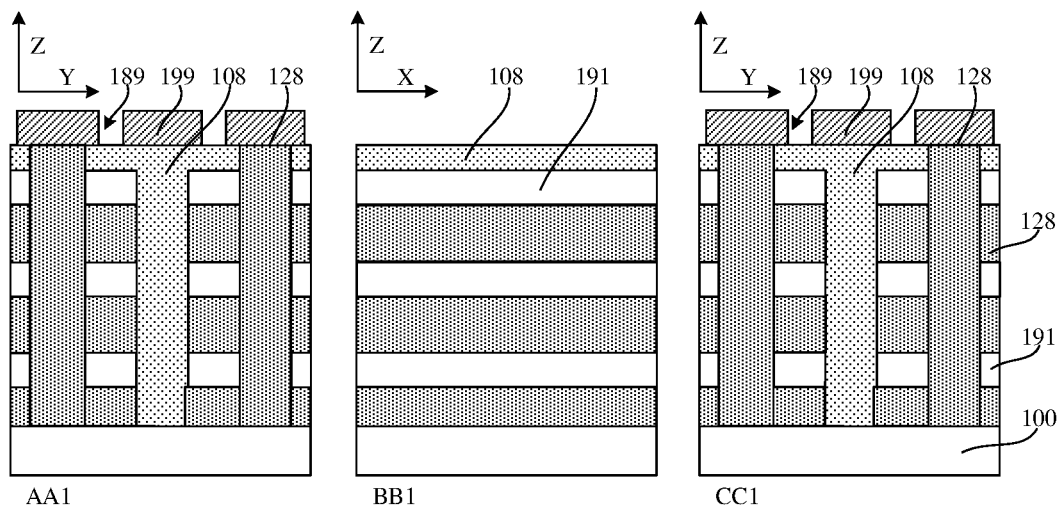
Figure 18:
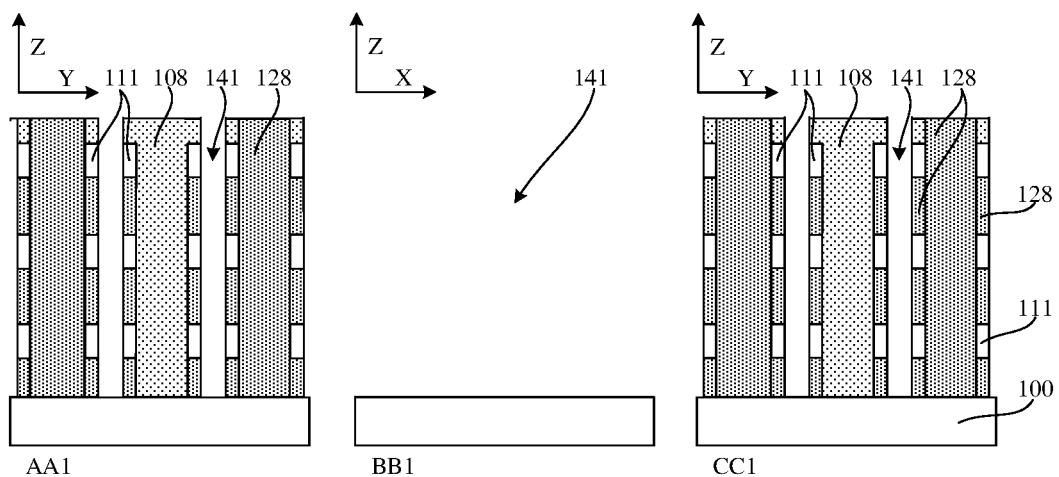

With reference to FIG. 17 and FIG. 18, the plurality of initial lower electrode layers 191 are patterned to form a plurality of lower electrode layers 111, in which each of the plurality of lower electrode layers 111 is provided with the U-shaped groove 141. In some embodiments, the operation that the plurality of initial lower electrode layers 191 are patterned may include the following operations. With reference to FIG. 17, a fifth mask layer 199 provided with a plurality of fifth openings 189 is formed on a top surface collectively formed by the dielectric layer 108 and the isolation layer 128, in which each of the plurality of fifth openings 189 extends in the first direction X, and the plurality of fifth openings 189 are arrayed in the second direction Y and spaced apart from each other. One of the plurality of fifth openings 189 directly faces to a center region of one of the plurality of initial lower electrode layers 191 arrayed in the second direction Y and spaced apart from each other. With reference to FIG. 17 and FIG. 18, the plurality of initial lower electrode layers 191 and the isolation layer 128 are etched through the plurality of fifth openings 189 by using the fifth mask layer 199 as a mask, so as to form the plurality of lower electrode layers 111, in which each lower electrode layer 111 is provided with the U-shaped groove 141, and each fifth opening 189 corresponds to the respective U-shaped grooves 141.

It should be noted that in the operation that the plurality of initial lower electrode layers 191 and the isolation layer 128 are etched through the plurality of fifth openings 189, the dielectric layer 108 exposed by the fifth openings 189 is further etched, so that the remaining portion of the dielectric layer 108 and the isolation layer 128 collectively isolate the adjacent lower electrode layers 111 from each other.

With reference to FIG. 18 and FIG. 10, the operation that the capacitor dielectric layer 121 and the upper electrode layer 131 are formed may include the following operation. The capacitor dielectric layer 121 and the upper electrode layer 131 at least completely filling the U-shaped groove 141 are formed, which contributes to forming the capacitor structure 101 shown in FIG. 4. In an example, the upper electrode layer 131 may include a diffusion barrier layer 131c conformally covering a surface of the capacitor dielectric layer 121 away from the lower electrode layer 111, and a conductive layer 131d covering a surface of the diffusion barrier layer 131c. The U-shaped groove 141 is only completely filled with the diffusion barrier layer 131c and the capacitor dielectric layer 121.

In some embodiments, with reference to FIG. 5, the operation that the plurality of initial lower electrode layers 191 are patterned may further include the following operation. Each of the plurality of initial lower electrode layers 191 is etched to form a through hole 181, in which the through hole 181 is arranged between the semiconductor channel 103 and the U-shaped groove 141. The operation that the capacitor dielectric layer 121 and the upper electrode layer 131 are formed may further include the following operation. The capacitor dielectric layer 121 and the upper electrode layer 131 at least completely filling the through hole 181 are formed, which contributes to forming the capacitor structure 101 shown in FIG. 5.

Figure 19:
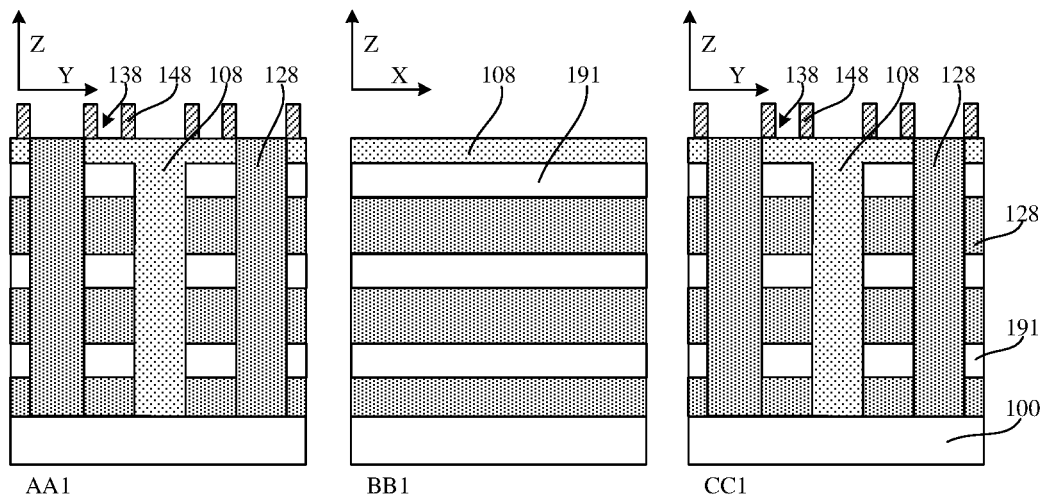
Figure 20:
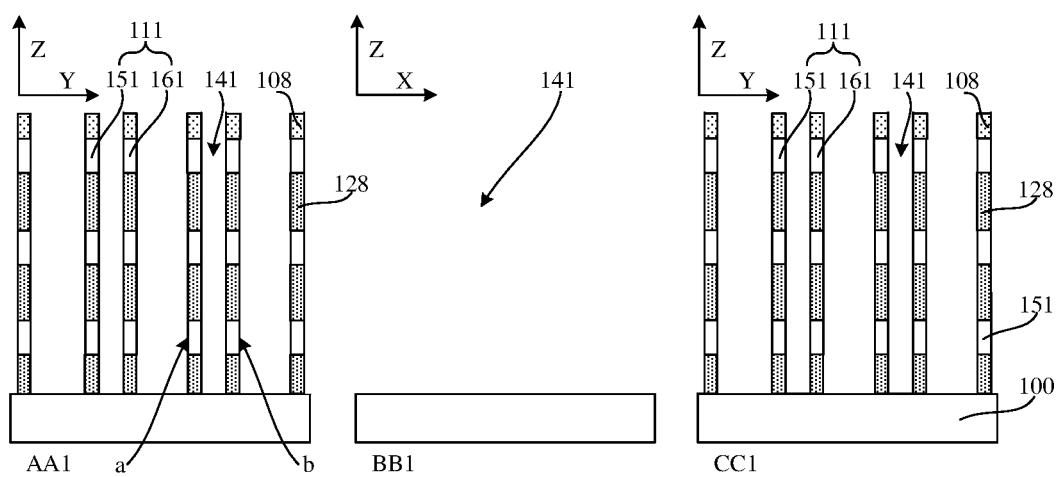

In some embodiments, with reference to FIG. 5, each of the plurality of lower electrode layers 111 may include a first region 171, a second region 151 and a third region 161. The second region 151 and the third region 161 are arranged opposite to each other in the second direction Y, and the first region 171 is in contact with the second region 151 and the third region 161. With reference to FIG. 19 and FIG. 20, the operation that the plurality of initial lower electrode layers 191 are patterned may further include the following operation. The dielectric layer 108 between the plurality of initial lower electrode layers 191 arrayed in the second direction Y is patterned, so as to expose a first sidewall a of the second region 151 away from the U-shaped groove 141, and to expose a second sidewall b of the third region 161 away from the U-shaped groove 141.

It can be understood that the operation that the plurality of initial lower electrode layers 191 are patterned may include the following operations. With reference to FIG. 19, a sixth mask layer 148 provided with a plurality of sixth openings 138 is formed on a top surface collectively formed by the dielectric layer 108 and the isolation layer 128, in which each sixth opening 138 extends in the first direction X, and the plurality of sixth openings 138 are arrayed in the second direction Y and spaced apart from each other. A portion of the plurality of sixth openings 138 directly faces to a center region of one of the plurality of initial lower electrode layers 191 arrayed in the second direction Y and spaced apart from each other, so as to subsequently form the U-shaped groove 141. A portion of the plurality of sixth openings 138 corresponds to the dielectric layer 108 or the isolation layer 128 between the plurality of initial lower electrode layers 191 arrayed in the second direction Y, so as to subsequently expose the first sidewall a and the second sidewall b. With reference to FIG. 19 and FIG. 20, the plurality of initial lower electrode layers 191, the dielectric layer 108 and the isolation layer 128 are etched through the plurality of sixth openings 138 by using the sixth mask layer 148 as a mask, so as to form the plurality of lower electrode layers 111 each provided with the U-shaped groove 141 and to expose the first sidewall a and the second sidewall b.

Figure 21:
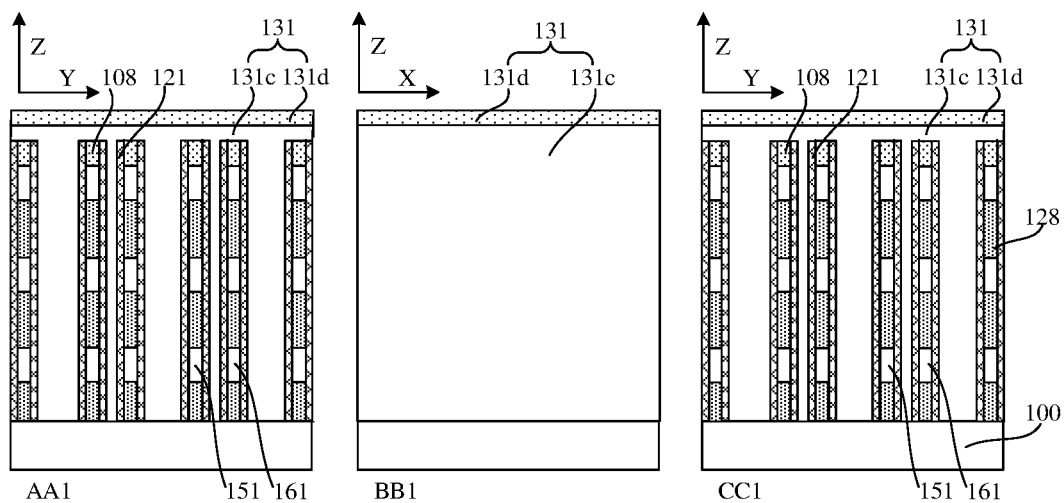

With reference to FIG. 20 and FIG. 21, the operation that the capacitor dielectric layer 121 and the upper electrode layer 131 are formed may further include the following operation. The capacitor dielectric layer 121 covering the first sidewall a and the second sidewall b is formed. The upper electrode layer 131 is formed on a side of the capacitor dielectric layer 121 away from the first sidewall a, and the upper electrode layer 131 is formed on a side of the capacitor dielectric layer 121 away from the second sidewall b. In this way, it contributes to forming the capacitor structure 101 shown in FIG. 6.

It should be noted that in an example, with reference to 6a in FIG. 6, the U-shaped groove 141 (with reference to FIG. 20) is only formed in the lower electrode layer 111, and the first sidewall a and the second sidewall b are exposed. The upper electrode layer 131 is further arranged on the first sidewall a and the second sidewall b, while the U-shaped groove 141 is completely filled with the capacitor dielectric layer 121 (with reference to FIG. 21) and the upper electrode layer 131. In another example, with reference to 6*b* in FIG. 6, not only the U-shaped groove 141 (with reference to FIG. 20) is formed in the lower electrode layer 111, but also the through hole 181 (with reference to FIG. 5) is formed in the lower electrode layer 111, and the first sidewall a and the second sidewall b are exposed. The U-shaped groove 141 and the through hole 181 are completely filled with the capacitor dielectric layer 121 (with reference to FIG. 21) and the upper electrode layer 131, and the upper electrode layer 131 is further arranged on the first sidewall a and the second sidewall b.

Figure 22:
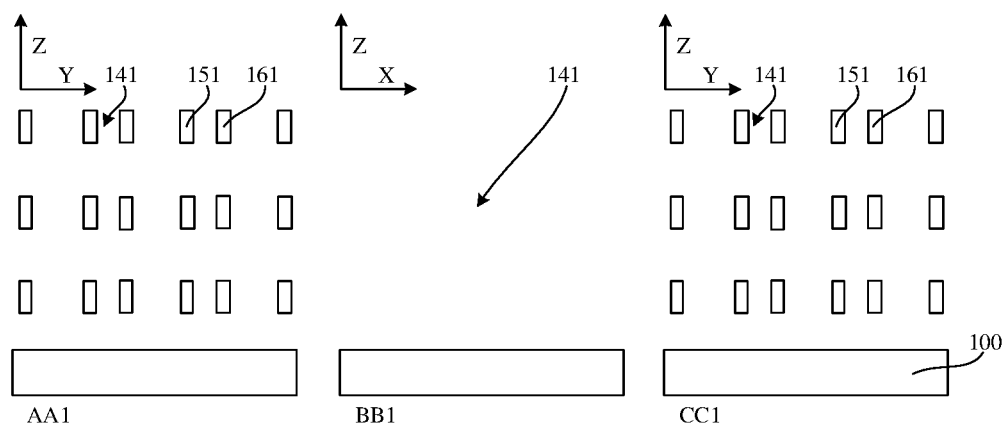

In some embodiments, with reference to FIG. 22, in the operation that the plurality of initial lower electrode layers 191 are patterned, the method may further include the following operation. The dielectric layer 108 (with reference to FIG. 19) between the plurality of initial lower electrode layers 191 arrayed in the third direction Z is removed, so as to expose sidewalls, which extend in the first direction X, of the second region 151, and to expose sidewalls, which extend in the first direction X, of the third region 161. It should be noted that in the operation that the dielectric layer 108 between the plurality of initial lower electrode layers 191 arrayed in the third direction Z is removed, the isolation layer 128 (with reference to FIG. 19) between the plurality of initial lower electrode layers 191 arrayed in the third direction Z is further removed, so as to expose the sidewalls, which extend in the first direction X, of the second region 151, and to expose the sidewalls, which extend in the first direction X, of the third region 161.

It can be understood that the operation that the plurality of initial lower electrode layers 191 are patterned to expose the sidewalls, which extend in the first direction X, of the second region 151, and to expose the sidewalls, which extend in the first direction X, of the third region 161 may be performed simultaneously with the operation that the plurality of initial lower electrode layers 191 are patterned to form the U-shaped grooves 141. A specific forming method is not limited herein.

Figure 23:
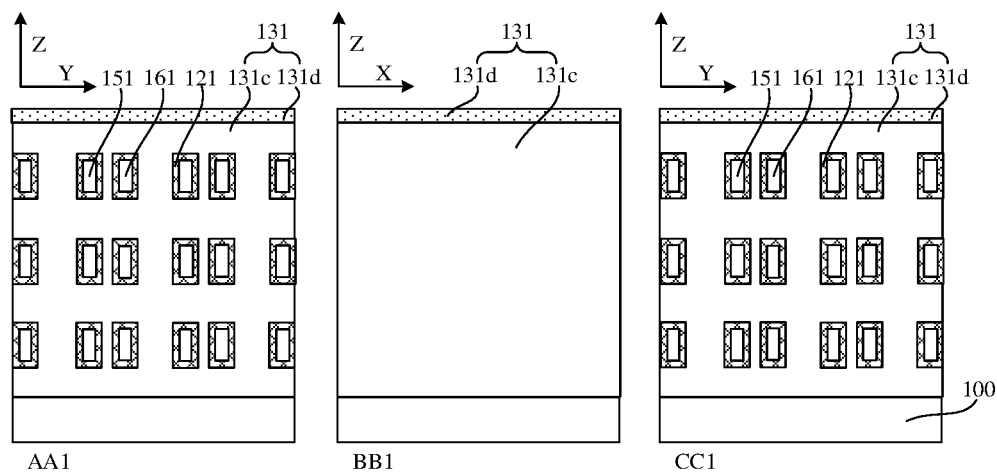

With reference to FIG. 22 and FIG. 23, the operation that the capacitor dielectric layer 121 and the upper electrode layer 131 are formed may further include the following operations. The capacitor dielectric layer 121 arranged around the sidewalls, which extend in the first direction X, of the second region 151 is formed, and the capacitor dielectric layer 121 arranged around the sidewalls, which extend in the first direction X, of the third region 161 is formed. The upper electrode layer 131 covering sidewalls, which extend in the first direction X, of the capacitor dielectric layer 121 is formed. In this way, it contributes to forming the capacitor structure 101 shown in FIG. 7.

It should be noted that in an example, with reference to 7*a* in FIG. 7, the U-shaped groove 141 (with reference to FIG. 22) is only formed in the lower electrode layer 111, and four sidewalls, which extend in the first direction X, of the second region 151 (with reference to FIG. 22), and four sidewalls, which extend in the first direction X, of the third region 161 (with reference to FIG. 22) are exposed, so that the subsequently formed upper electrode layer 131 directly faces to the above eight sidewalls. In another example, with reference to 7*b* in FIG. 7, not only the U-shaped groove 141 (with reference to FIG. 22) is formed in the lower electrode layer 111, but also the through hole 181 (with reference to FIG. 5) is formed in the lower electrode layer 111, and the four sidewalls, which extend in the first direction X, of the second region 151 (with reference to FIG. 22), and the four sidewalls, which extend in the first direction X, of the third region 161 (with reference to FIG. 22) are exposed, so that the subsequently formed upper electrode layer 131 not only directly faces to the above eight sidewalls, but also directly faces to the sidewalls, which are configured for forming the through hole 181, of the lower electrode layer 111.

The operation that the dielectric layer 108 is patterned will be described in detail in the three following embodiments.

In some embodiments, with reference to FIG. 13 and FIG. 14, the plurality of semiconductor pillars 107 may include a first semiconductor pillar 167 and a second semiconductor pillar 177, the first semiconductor pillar 167 and the second semiconductor pillar 177 being arranged adjacent to each other. The operation that the dielectric layer 108 is patterned may include the following operations. A first mask layer 119 provided with a plurality of first openings 109 is provided, in which each of the plurality of first openings 109 extends in the first direction X, the first mask layer 119 between any two adjacent first openings 109 of the plurality of first openings 109 directly faces to the dielectric layer 108 between the first semiconductor pillar 167 and the second semiconductor pillar 177, and the dielectric layer 108 arranged on a side of the first semiconductor pillar 167 away from the second semiconductor pillar 177 directly faces to a respective one of the plurality of first openings 109.

It should be noted that the first mask layer 119 between two respective adjacent first openings 109 directly facing toward the dielectric layer 108 between the first semiconductor pillar 167 and the second semiconductor pillar 177 means that an orthographic projection of the dielectric layer 108 between the first semiconductor pillar 167 and the second semiconductor pillar 177 on the substrate 100 is located in an orthographic projection of the first mask layer 119 arranged between the two respective adjacent first openings 109 on the substrate 100. The dielectric layer 108 arranged on a side of the first semiconductor pillar 167 away from the second semiconductor pillar 177 directly facing toward the respective one of the plurality of first openings 109 means that an orthographic projection of the dielectric layer 108 arranged on the side of the first semiconductor pillar 167 away from the second semiconductor pillar 177 on the substrate 100 is located in an orthographic projection of the respective first opening 109 on the substrate 100. In addition, one of the first openings 109 directly faces to the dielectric layer 108 arranged on a side of the first semiconductor pillar 167 away from the second semiconductor pillar 177, and the other one of the first openings 109 directly faces to the dielectric layer 108 arranged on a side of the second semiconductor pillar 177 away from the first semiconductor pillar 167.

It can be understood that two semiconductor pillars 107, i.e., the first semiconductor pillar 167 and the second semiconductor pillar 177, are arranged between the two adjacent first openings 109, so that the dielectric layer 108 arranged between the first semiconductor pillar 167 and the second semiconductor pillar 177 will be remained as the supporting structure for supporting the initial lower electrode layers 191 in the operation that the initial lower electrode layers 191 are etched to form the lower electrode layers 111.

With reference to FIG. 13 and FIG. 15, the dielectric layer 108 is etched by using the first mask layer 119 as a mask, in which a remaining portion of the dielectric layer 108 is in contact with the first semiconductor layers 117. It can be understood that in an example, in the operation that the dielectric layer 108 is etched by using the first mask layer 119 as the mask, the second semiconductor layers 127 in the semiconductor pillar 107 are further removed. In order to avoid collapse of the first semiconductor layers 117, the remaining portion of the dielectric layer 108 may be used as the supporting structure for the first semiconductor layers 117, so as to further support the initial lower electrode layers in the operation that the initial lower electrode layers are subsequently etched to form the lower electrode layers, and to support the formed lower electrode layers. In another example, the second semiconductor layers 127 exposed by the remaining portion of the dielectric layer 108 may be then etched after the dielectric layer 108 is etched by using the first mask layer 119 as the mask.

Figure 24:
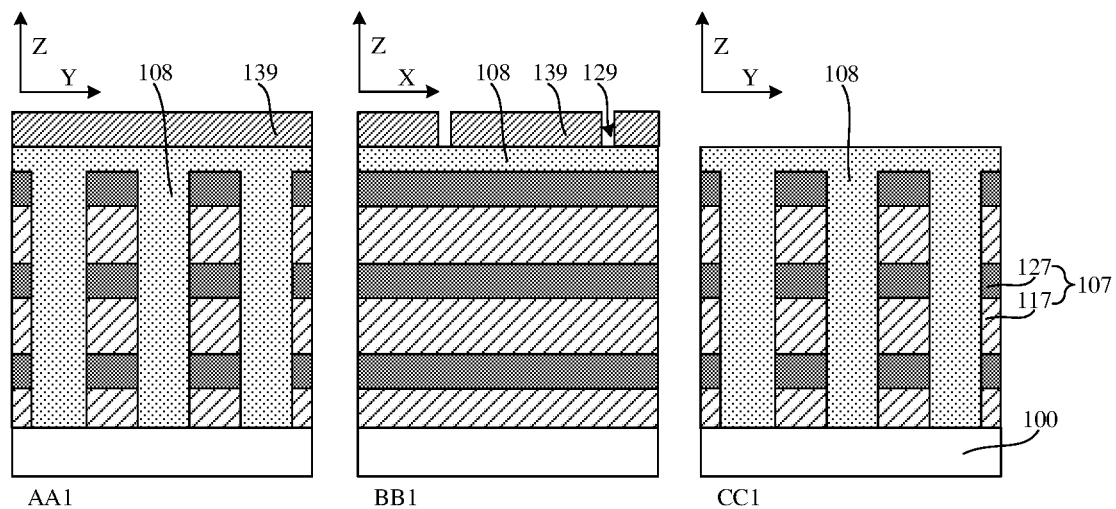
Figure 25:
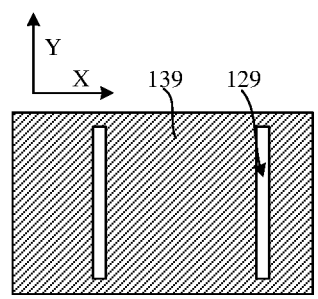
Figure 26:
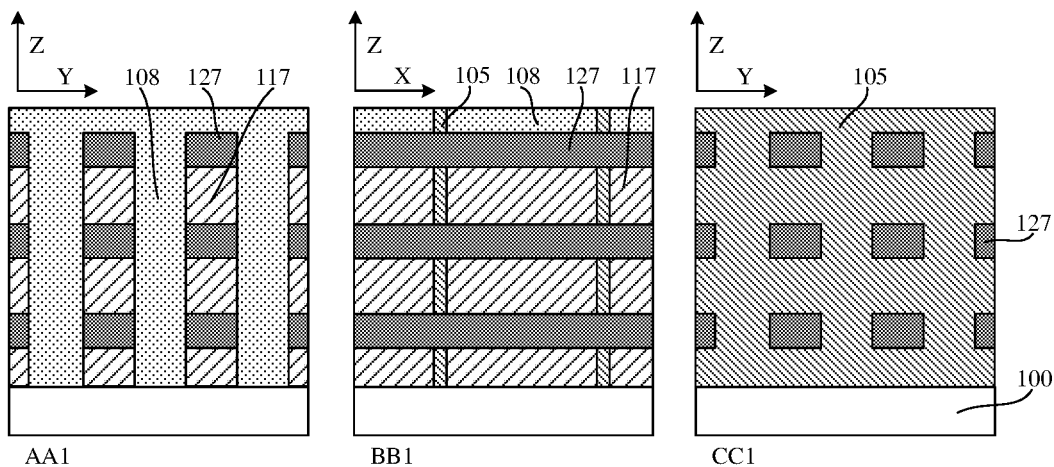

In some embodiments, with reference to FIG. 24 to FIG. 26, the operation that the dielectric layer 108 is patterned may include the following operations.

With reference to FIG. 24 and FIG. 25, a second mask layer 139 provided with a plurality of second openings 129 is provided, in which each of the plurality of second openings 129 extends in the second direction Y. With reference to FIG. 24 and FIG. 26, the dielectric layer 108 directly facing toward the plurality of second openings 129 is removed. It should be noted that the dielectric layer 108 directly facing toward the plurality of second openings 129 refers to the dielectric layer 108 of which the orthographic projection on the substrate 100 coincides with orthographic projections of the second openings 129 on the substrate 100.

With reference to FIG. 24 and FIG. 26, after the dielectric layer 108 is patterned and before the plurality of void structures 118 (with reference to FIG. 28) are formed, the method for manufacturing the semiconductor structure may further include the following operations. Portions of each of the plurality of first semiconductor layers 117 exposed by the dielectric layer 108 and directly facing toward the plurality of second openings 129 are etched, so as to form a plurality of first gaps. A plurality of supporting layers 105 are formed, in which each of the plurality of first gaps is at least completely filled with a respective one of the plurality of supporting layers 105, and each of the plurality of supporting layers 105 is arranged around a portion of each sidewall, which extends in the first direction X, of each of the plurality of second semiconductor layers 127.

It can be understood that with reference to FIG. 26, the supporting layer 105 is arranged around portions of each of four sidewalls, which extend in the first direction X, of each second semiconductor layer 127. One supporting layer 105 is arranged around a portion of each sidewall of the plurality of second semiconductor layers 127 arranged in an array in the first direction X and in the second direction Y.

Figure 27:
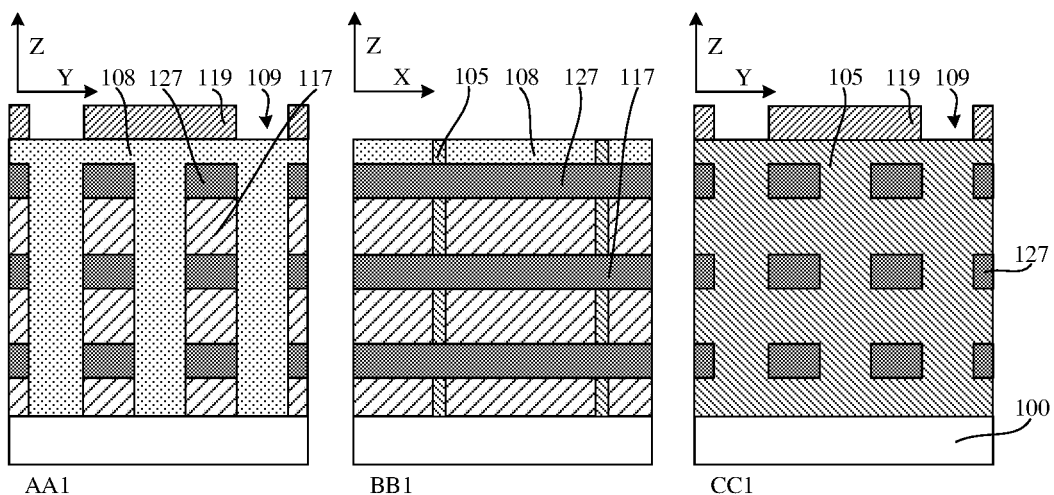
Figure 28:
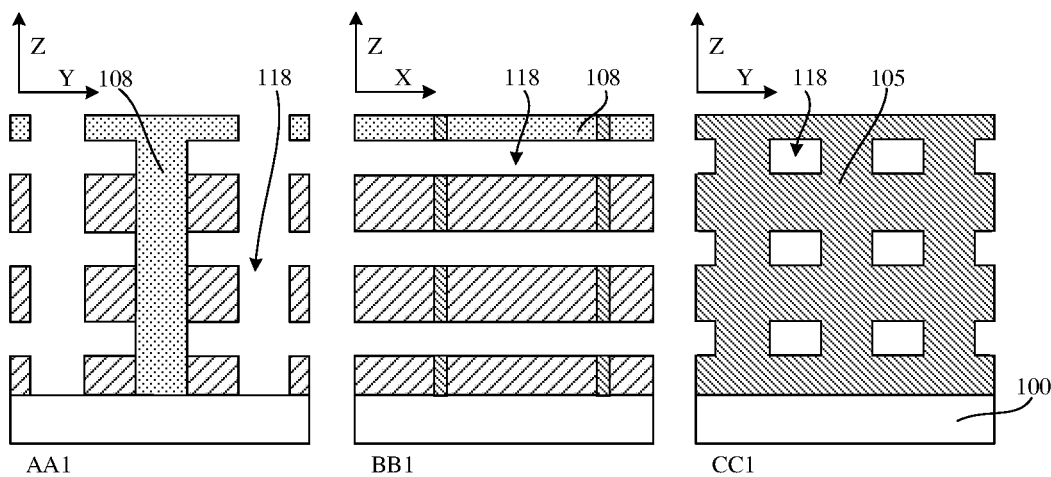

With reference to FIG. 27 and FIG. 28, the operation that the plurality of void structures 118 are formed may further include the following operation. A portion of a remaining portion of the dielectric layer 108 is etched to expose portions of each of the plurality of second semiconductor layers 127. Specifically, with reference to FIG. 27, the first mask layer 119 provided with the first openings 109 is formed on the top surface collectively formed by the dielectric layer 108 and the supporting layers 105, and the dielectric layer 108 is etched by using the first mask layer 119 as the mask. With reference to FIG. 28, the second semiconductor layers 127 exposed by the dielectric layer 108 are etched to form the void structures 118. It should be noted that in the operation that portions of the initial lower electrode layers 191 are etched subsequently by using an etching process, the initial lower electrode layers 191 surrounded by the supporting layer 105 will not be etched.

Figure 29:
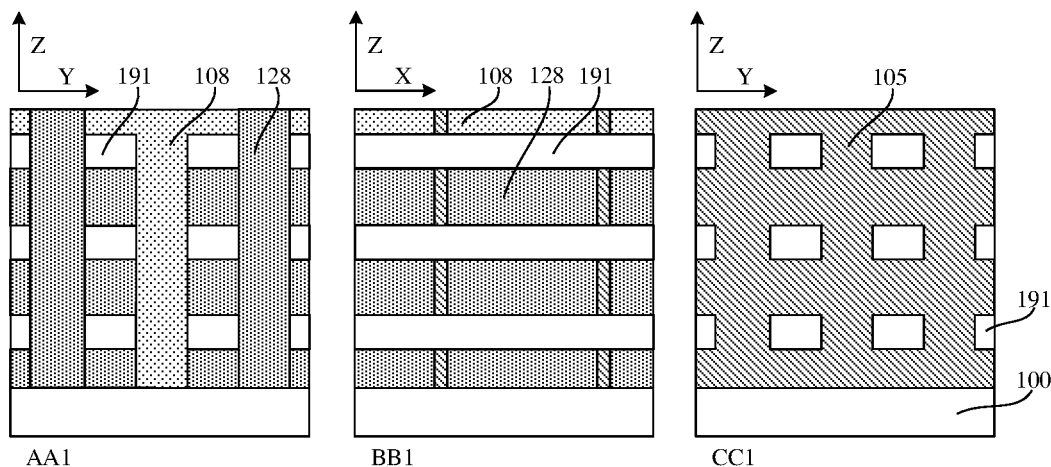
Figure 30:
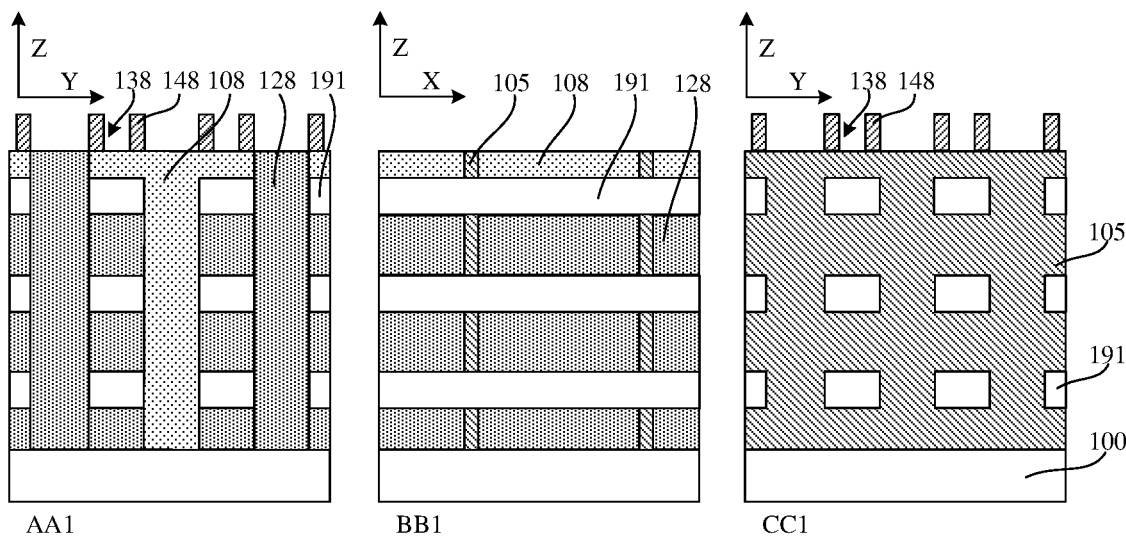
Figure 31:
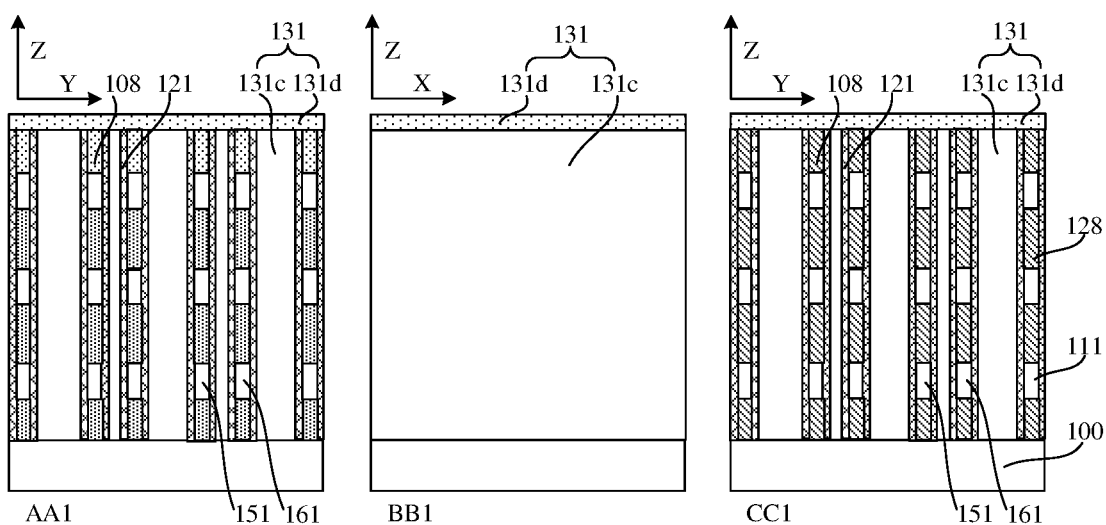

With reference to FIG. 29, the isolation layer 128 is formed. With reference to FIG. 30, a sixth mask layer 148 provided with a plurality of sixth openings 138 is formed on the top surface collectively formed by the dielectric layer 108 and the isolation layer 128. With reference to FIG. 30 and FIG. 31, the initial lower electrode layers 191, the dielectric layer 108 and the isolation layer 128 are etched through the sixth openings 138 by using the sixth mask layer 148 as a mask, so as to form the lower electrode layers 111 each provided with the U-shaped groove 141 (with reference to FIG. 5), and to expose the first sidewalls a (with reference to FIG. 5) and the second sidewalls b (with reference to FIG. 5). In this way, it contributes to forming the semiconductor structure shown in 8a in FIG. 8.

It should be noted that the operation that the isolation layer 128 is formed and the operation that the initial lower electrode layers 191, the dielectric layer 108 and the isolation layer 128 are etched through the sixth openings 138 by using the sixth mask layer 148 as the mask are substantially consistent with the aforementioned embodiments, which is not repeated herein. The difference lies in that the supporting layers 105 will not be removed in the subsequent etching process. In addition, FIG. 30 and FIG. 31 only illustrate a method for etching the initial lower electrode layers 191. Aforementioned methods for etching the initial lower electrode layers 191 are suitable for the initial lower electrode layers 191, portions of which is surrounded by the supporting layers 105.

Figure 32:
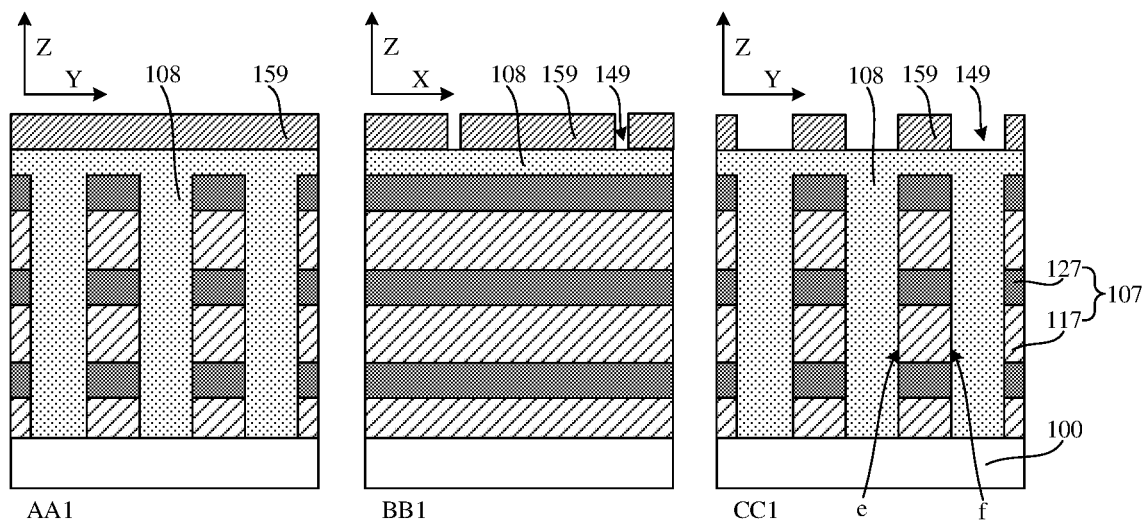
Figure 33:
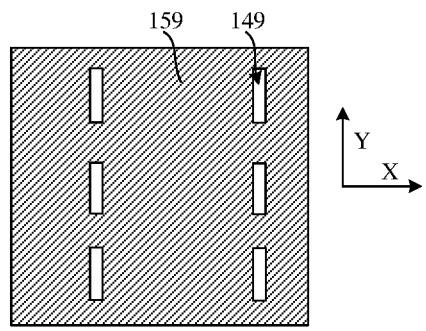

In some other embodiments, with reference to FIG. 32 and FIG. 33, in the second direction Y, each of the plurality of semiconductor pillars 107 includes a seventh sidewall e and an eighth sidewall f, the seventh sidewall e and the eighth sidewall f being arranged opposite to each other. The operation that the dielectric layer 108 is patterned may further include the following operations. A third mask layer 159 provided with a plurality of third openings 149 is provided, in which the plurality of third openings 149 are arrayed in the second direction Y and in the first direction X and spaced apart from each other, and portions of the dielectric layer 108 are exposed by the plurality of third openings 149. The dielectric layer 108 directly facing toward the plurality of third openings 149 is removed to form a plurality of second gaps, in which each of the seventh sidewall e and the eighth sidewall f is exposed by a respective one of the plurality of second gaps. It should be noted that the dielectric layer 108 directly facing toward the third openings 149 refers to the dielectric layer 108, of which the orthographic projection on the substrate 100 coincides with that of each third opening 149 on the substrate 100. In this way, the first semiconductor layers 117 arrayed in the third direction X and spaced apart from each other will not be removed.

Figure 34:
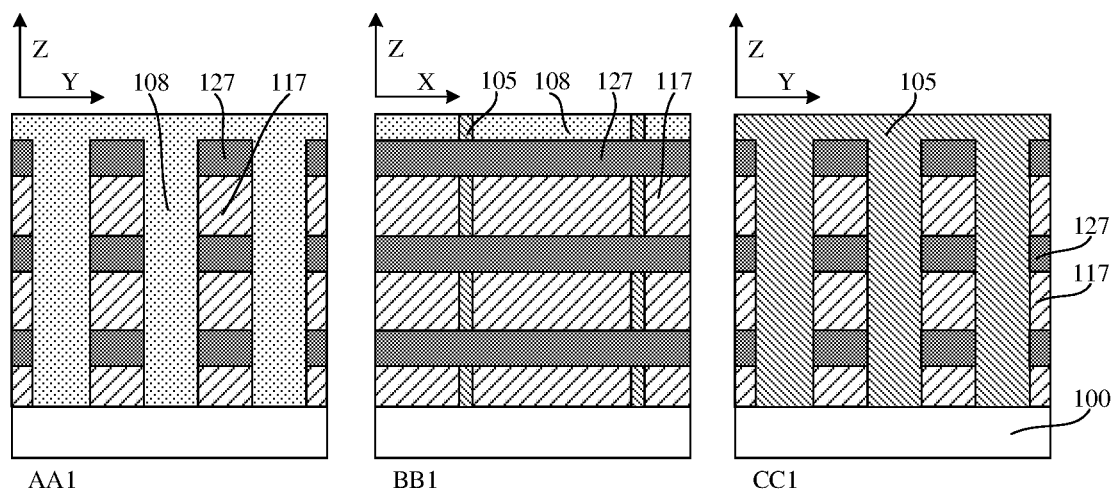

With reference to FIG. 32 to FIG. 34, after the dielectric layer 108 is patterned and before the plurality of void structures 118 (with reference to FIG. 28) is formed, the method for manufacturing the semiconductor structure may further include the following operation. A plurality of supporting layers 105 are formed, in which each of the plurality of second gaps is at least completely filled with a respective one of the plurality of supporting layers 105. It can be understood that the supporting layer 105 is arranged on the seventh sidewall e and the eighth sidewall f. The supporting layer 105 separates the second semiconductor layers 127 arrayed in the second direction Y from each other, and the first semiconductor layers 117 separate the second semiconductor layers 127 arrayed in the third direction Z from each other.

With reference to FIG. 34, FIG. 27 and FIG. 28, the operation that the plurality of void structures 118 are formed may further include the following operation. A portion of a remaining portion of the dielectric layer 108 is etched to expose portions of each of the plurality of second semiconductor layers 127. It should be noted that the operation that a portion of a remaining portion of the dielectric layer 108 is etched to expose portions of each of the plurality of second semiconductor layers 127, the operation that the second semiconductor layers 127 exposed by the dielectric layer 108 are etched to form the plurality of void structures 118, the operation that the isolation layer 128 is formed and the operation that the plurality of initial lower electrode layers 191 are subsequently etched are substantially consistent with the aforementioned embodiments, which is not repeated in detail herein. The difference lies in that the supporting layers 105 will not be removed in the subsequent etching process. In this way, it contributes to forming the semiconductor structure shown in 8b in FIG. 8.

Overall, in the method for manufacturing the semiconductor structure provided by another embodiment of the disclosure, it contributes to forming the lower electrode layer 111 at least provided with the U-shaped groove 141. The sidewalls, which form the U-shaped groove 141, of the lower electrode layer 111 all directly face toward the upper electrode layer 131, so as to increase the direct-facing area between the upper electrode layer 131 and the lower electrode layer 111. Furthermore, in the second direction Y, the upper electrode layer 131 is arranged in the lower electrode layer 111, which contributes to reducing the overall layout area occupied by the upper electrode layer 131, without increasing the width of the lower electrode layer 111. Therefore, it contributes to improving the integration density of the capacitor structures 101 in the semiconductor structure, while improving the capacitance of the capacitor structure 101.

Those of ordinary skill in the art may understand that the above embodiments are specific embodiments to implement the disclosure. In practical applications, variations changes may be made in forms and details without departing from the spirit and scope of the disclosure. Those skilled in the art may make changes and modifications without departing from the spirit and scope of the disclosure. Therefore, the protection scope of the disclosure should be subjected to the scope defined by the appended claims.

The invention claimed is:

1. A method for manufacturing a semiconductor structure, comprising:
providing a substrate; and
forming a plurality of capacitor structures on a surface of the substrate, wherein each of the plurality of capacitor structures extends in a first direction, and the first direction is parallel to the surface of the substrate, wherein each of the plurality of capacitor structures comprises a lower electrode layer, a capacitor dielectric layer and an upper electrode layer, wherein the lower electrode layer is provided with a U-shaped groove, the U-shaped groove is at least completely filled with the capacitor dielectric layer and the upper electrode layer, and the capacitor dielectric layer is arranged between the lower electrode layer and the upper electrode layer;
wherein forming the plurality of capacitor structures comprises: forming the plurality of capacitor structures arrayed in a third direction and in a second direction and spaced apart from each other;
wherein forming a plurality of lower electrode layers comprises:
forming a plurality of semiconductor pillars on the substrate, wherein the plurality of semiconductor pillars are arrayed in the second direction and spaced apart from each other, each of the plurality of semiconductor pillars extends in the first direction, each of the plurality of semiconductor pillars comprises a plurality of first semiconductor layers and a plurality of second semiconductor layers, the plurality of first semiconductor layers and the plurality of second semiconductor layers being alternately stacked on one another in the third direction, and the first direction, the second direction and the third direction intersect with each other;
forming a dielectric layer, wherein gaps between any two adjacent semiconductor pillars of the plurality of semiconductor pillars are at least completely filled with the dielectric layer;
patterning the dielectric layer, and etching portions of each of the plurality of second semiconductor layers exposed by the dielectric layer, to form a plurality of void structures;
forming an initial lower electrode layer in each of the plurality of void structures, wherein a plurality of initial lower electrode layers are arrayed in the second direction and in the third direction and spaced apart from each other; and
patterning the plurality of initial lower electrode layers to form a plurality of lower electrode layers, wherein each of the plurality of lower electrode layers is provided with the U-shaped groove.

2. The method for manufacturing the semiconductor structure according to claim 1, further comprising: forming a bit line and a transistor structure, wherein the transistor structure comprises a semiconductor channel and a gate structure; wherein forming the transistor structure comprises:
forming the semiconductor channel, wherein a cross-section of the semiconductor channel parallel to the surface of the substrate is U-shaped, the semiconductor channel is provided with a first end, a second end and a third end, wherein the first end is arranged on a same side as the second end, the third end is arranged opposite to the first end, one of the first end and the second end is in contact with the bit line, and the other one of the first end and the second end is in contact with the lower electrode layer; and
forming the gate structure at the third end.

3. The method for manufacturing the semiconductor structure according to claim 1, wherein patterning the plurality of initial lower electrode layers further comprises:
etching each of the plurality of initial lower electrode layers to form a through hole, wherein the through hole is arranged between a semiconductor channel of a transistor structure and the U-shaped groove;
wherein forming the capacitor dielectric layer and the upper electrode layer further comprises:
forming the capacitor dielectric layer and the upper electrode layer at least completely filling the through hole.

4. The method for manufacturing the semiconductor structure according to claim 1, wherein each of the plurality of lower electrode layers comprises a first region, a second region, and a third region, wherein the second region and the third region are arranged opposite to each other in the second direction, and the first region is in contact with the second region and the third region; wherein patterning the plurality of initial lower electrode layers further comprises:
patterning the dielectric layer between the plurality of initial lower electrode layers arrayed in the second direction, to expose a first sidewall of the second region away from the U-shaped groove, and to expose a second sidewall of the third region away from the U-shaped groove;

wherein forming the capacitor dielectric layer and the upper electrode layer further comprises:

forming the capacitor dielectric layer covering the first sidewall and the second sidewall; and forming the upper electrode layer on a side of the capacitor dielectric layer away from the first sidewall, and forming the upper electrode layer on a side of the capacitor dielectric layer away from the second sidewall.

5. The method for manufacturing the semiconductor structure according to claim 4, wherein patterning the plurality of initial lower electrode layers further comprises:

removing the dielectric layer between the plurality of initial lower electrode layers arrayed in the third direction, to expose sidewalls, which extend in the first direction, of the second region, and to expose sidewalls, which extend in the first direction, of the third region;

wherein forming the capacitor dielectric layer and the upper electrode layer further comprises:

forming the capacitor dielectric layer arranged around the sidewalls, which extend in the first direction, of the second region, and forming the capacitor dielectric layer arranged around the sidewalls, which extend in the first direction, of the third region; and forming the upper electrode layer covering sidewalls, which extend in the first direction, of the capacitor dielectric layer.

6. The method for manufacturing the semiconductor structure according to claim 1, wherein the plurality of semiconductor pillars comprise a first semiconductor pillar and a second semiconductor pillar, the first semiconductor pillar and the second semiconductor pillar being arranged adjacent to each other, wherein patterning the dielectric layer comprises:

providing a first mask layer provided with a plurality of first openings, wherein each of the plurality of first openings extends in the first direction, the first mask layer between two respective adjacent first openings of the plurality of first openings directly faces toward the dielectric layer between the first semiconductor pillar and the second semiconductor pillar, and the dielectric layer arranged on a side of the first semiconductor pillar away from the second semiconductor pillar directly faces toward a respective one of the plurality of first openings; and etching the dielectric layer by using the first mask layer as a mask, wherein a remaining portion of the dielectric layer is in contact with a remaining portion of each of the plurality of first semiconductor layers.

7. The method for manufacturing the semiconductor structure according to claim 1, wherein patterning the dielectric layer comprises:

providing a second mask layer provided with a plurality of second openings, wherein each of the plurality of second openings extends in the second direction; and removing the dielectric layer directly facing toward the plurality of second openings;

wherein after patterning the dielectric layer and before forming the plurality of void structures, the method further comprises:

etching portions of each of the plurality of first semiconductor layers exposed by the dielectric layer and directly facing toward the plurality of second openings, to form a plurality of first gaps; and forming a plurality of supporting layers, wherein each of the plurality of first gaps is at least completely filled with a respective one of the plurality of supporting layers, and each of the plurality of supporting layers is arranged around a portion of each sidewall, which extends in the first direction, of each of the plurality of second semiconductor layers;

wherein forming the plurality of void structures further comprises: etching a portion of a remaining portion of the dielectric layer to expose portions of each of the plurality of second semiconductor layers.

8. The method for manufacturing the semiconductor structure according to claim 1, wherein in the second direction, each of the plurality of semiconductor pillars comprises a seventh sidewall and an eighth sidewall, the seventh sidewall and the eighth sidewall being arranged opposite to each other; wherein patterning the dielectric layer comprises:

providing a third mask layer provided with a plurality of third openings, wherein the plurality of third openings are arrayed in the second direction and in the first direction and spaced apart from each other, and portions of the dielectric layer are exposed by the plurality of third openings; and removing the dielectric layer directly facing toward the plurality of third openings to form a plurality of second gaps, wherein each of the seventh sidewall and the eighth sidewall is exposed by a respective one of the plurality of second gaps;

wherein after patterning the dielectric layer and before forming the plurality of void structures, the method further comprises: forming a plurality of supporting layers, wherein each of the plurality of second gaps is at least completely filled with a respective one of the plurality of supporting layers;

wherein forming the plurality of void structures further comprises: etching a portion of a remaining portion of the dielectric layer to expose portions of each of the plurality of second semiconductor layers.

9. The method for manufacturing the semiconductor structure according to claim 1, wherein forming the plurality of semiconductor pillars comprises: forming a multi-layer stack structure on the substrate, wherein the multi-layer stack structure comprises an initial first semiconductor layer and an initial second semiconductor layer arranged on a side of the initial first semiconductor layer away from the substrate; and patterning the multi-layer stack structure to form the plurality of semiconductor pillars.

* * * * *